United States Patent
Fleming et al.

(10) Patent No.: US 8,054,140 B2
(45) Date of Patent: Nov. 8, 2011

(54) LOW VOLTAGE OSCILLATOR FOR MEDICAL DEVICES

(75) Inventors: Robert Fleming, Nicasio, CA (US); Cherie Kushner, Nicasio, CA (US); Nilay Jani, Sunnyvale, CA (US); Jonathan Withrington, San Francisco, CA (US); Mark Zdeblick, Portola Valley, CA (US)

(73) Assignee: Proteus Biomedical, Inc., Redwood City, CA (US)

( * ) Notice: Subject to any disclaimer, the term of this patent is extended or adjusted under 35 U.S.C. 154(b) by 0 days.

(21) Appl. No.: 12/445,723

(22) PCT Filed: Oct. 17, 2007

(86) PCT No.: PCT/US2007/022257
§ 371 (c)(1),
(2), (4) Date: Mar. 3, 2010

(87) PCT Pub. No.: WO2008/066617
PCT Pub. Date: Jun. 5, 2008

(65) Prior Publication Data
US 2010/0214033 A1    Aug. 26, 2010

Related U.S. Application Data

(60) Provisional application No. 60/829,832, filed on Oct. 17, 2006.

(51) Int. Cl.
*H03K 3/03* (2006.01)
(52) U.S. Cl. .......................................... 331/57; 331/186
(58) Field of Classification Search .................... 331/57, 331/185, 186, 175, 176
See application file for complete search history.

(56) References Cited

U.S. PATENT DOCUMENTS

| | | | |
|---|---|---|---|
| 3,607,788 | A | 9/1971 | Adolph |
| 3,642,008 | A | 2/1972 | Bolduc |
| 3,679,480 | A | 7/1972 | Brown et al. |
| 3,719,183 | A | 3/1973 | Schwartz |
| 3,828,766 | A | 8/1974 | Krasnow |
| 3,989,050 | A | 11/1976 | Buchalter |
| 4,077,397 | A | 3/1978 | Ellis |
| 4,077,398 | A | 3/1978 | Ellis |
| 4,082,087 | A | 4/1978 | Howson |
| 4,090,752 | A | 5/1978 | Long |
| 4,106,348 | A | 8/1978 | Auphan |
| 4,129,125 | A | 12/1978 | Lester |

(Continued)

FOREIGN PATENT DOCUMENTS

EP      1246356 A1    10/2002

(Continued)

OTHER PUBLICATIONS

Hwang, et al., "A CMOS Self-Regulating VCO with Low Supply Sensitivity", Jan. 2004, IEEE Journal of Solid-State Circuits, vol. 39, No. 1, pp. 42-48.*

(Continued)

*Primary Examiner* — Ryan Johnson
(74) *Attorney, Agent, or Firm* — Bozicevic, Field & Francis LLP; Bret E. Field

(57) ABSTRACT

Low voltage oscillators that provide a stable output frequency with varying supply voltage are provided. The subject oscillators find use in a variety of different types of devices, e.g., medical devices, including both implantable and ex-vivo devices.

27 Claims, 12 Drawing Sheets

U.S. PATENT DOCUMENTS

| | | | |
|---|---|---|---|
| 4,166,453 | A | 9/1979 | McClelland |
| 4,239,046 | A | 12/1980 | Ong |
| 4,269,189 | A | 5/1981 | Abraham |
| 4,331,654 | A | 5/1982 | Morris |
| 4,345,588 | A | 8/1982 | Widder et al. |
| 4,418,697 | A | 12/1983 | Tama |
| 4,425,117 | A | 1/1984 | Hugemann et al. |
| 4,494,950 | A | 1/1985 | Fischell |
| 4,559,950 | A | 12/1985 | Vaughan |
| 4,594,565 | A * | 6/1986 | Barreras ............... 331/108 A |
| 4,635,641 | A | 1/1987 | Hoffman |
| 4,654,165 | A | 3/1987 | Eisenberg |
| 4,669,479 | A | 6/1987 | Dunseath |
| 4,725,997 | A | 2/1988 | Urquhart et al. |
| 4,763,659 | A | 8/1988 | Dunseath |
| 4,784,162 | A | 11/1988 | Ricks |
| 4,793,825 | A | 12/1988 | Benjamin et al. |
| 4,844,076 | A | 7/1989 | Lesho |
| 4,896,261 | A | 1/1990 | Nolan |
| 4,975,230 | A | 12/1990 | Pinkhasov |
| 4,987,897 | A | 1/1991 | Funke |
| 5,016,634 | A | 5/1991 | Vock et al. |
| 5,079,006 | A | 1/1992 | Urquhart |
| 5,167,626 | A | 12/1992 | Casper |
| 5,176,626 | A | 1/1993 | Soehendra |
| 5,261,402 | A | 11/1993 | DiSabito |
| 5,263,481 | A | 11/1993 | Axelgaard et al. |
| 5,281,287 | A | 1/1994 | Lloyd |
| 5,283,136 | A | 2/1994 | Peled et al. |
| 5,318,557 | A | 6/1994 | Gross |
| 5,394,882 | A | 3/1995 | Mawhinney |
| 5,458,141 | A | 10/1995 | Neil et al. |
| 5,485,841 | A | 1/1996 | Watkin et al. |
| 5,596,302 | A | 1/1997 | Mastrocola et al. |
| 5,634,468 | A | 6/1997 | Platt |
| 5,645,063 | A | 7/1997 | Straka et al. |
| 5,740,811 | A | 4/1998 | Hedberg |
| 5,792,048 | A | 8/1998 | Schaefer |
| 5,802,467 | A | 9/1998 | Salazar |
| 5,833,716 | A | 11/1998 | Bar-Or |
| 5,845,265 | A | 12/1998 | Woolston |
| 5,862,803 | A | 1/1999 | Besson |
| 5,868,136 | A | 2/1999 | Fox |
| 5,925,030 | A | 7/1999 | Gross et al. |
| 5,955,929 | A * | 9/1999 | Moon et al. ............... 331/57 |
| 5,957,854 | A | 9/1999 | Besson |
| 5,974,124 | A | 10/1999 | Schlueter, Jr. et al. |
| 5,999,846 | A | 12/1999 | Pardey et al. |
| 6,038,464 | A | 3/2000 | Axelgaard et al. |
| 6,042,710 | A | 3/2000 | Dubrow |
| 6,047,203 | A | 4/2000 | Sackner |
| 6,081,734 | A | 6/2000 | Batz |
| 6,095,985 | A | 8/2000 | Raymond et al. |
| 6,122,351 | A | 9/2000 | Schlueter, Jr. et al. |
| 6,141,592 | A | 10/2000 | Pauly |
| 6,200,265 | B1 | 3/2001 | Walsh et al. |
| 6,206,702 | B1 | 3/2001 | Hayden et al. |
| 6,217,744 | B1 | 4/2001 | Crosby |
| 6,231,593 | B1 | 5/2001 | Meserol |
| 6,245,057 | B1 | 6/2001 | Sieben et al. |
| 6,285,897 | B1 | 9/2001 | Kilcoyne et al. |
| 6,287,252 | B1 | 9/2001 | Lugo |
| 6,289,238 | B1 | 9/2001 | Besson |
| 6,315,719 | B1 | 11/2001 | Rode et al. |
| 6,358,202 | B1 | 3/2002 | Arent |
| 6,364,834 | B1 | 4/2002 | Reuss |
| 6,366,206 | B1 | 4/2002 | Ishikawa et al. |
| 6,371,927 | B1 | 4/2002 | Brune |
| 6,374,670 | B1 | 4/2002 | Spelman |
| 6,380,858 | B1 | 4/2002 | Yarin et al. |
| 6,394,997 | B1 | 5/2002 | Lemelson |
| 6,426,863 | B1 | 7/2002 | Munshi |
| 6,432,292 | B1 | 8/2002 | Pinto et al. |
| 6,440,069 | B1 | 8/2002 | Raymond et al. |
| 6,441,747 | B1 | 8/2002 | Khair |
| 6,477,424 | B1 | 11/2002 | Thompson et al. |
| 6,496,705 | B1 | 12/2002 | Ng et al. |
| 6,526,315 | B1 | 2/2003 | Inagawa |
| 6,544,174 | B2 | 4/2003 | West |
| 6,564,079 | B1 | 5/2003 | Cory |
| 6,577,893 | B1 | 6/2003 | Besson |
| 6,579,231 | B1 | 6/2003 | Phipps |
| 6,609,018 | B2 | 8/2003 | Cory |
| 6,612,984 | B1 | 9/2003 | Kerr |
| 6,632,175 | B1 | 10/2003 | Marshall |
| 6,632,216 | B2 | 10/2003 | Houzego et al. |
| 6,643,541 | B2 | 11/2003 | Mok et al. |
| 6,650,191 | B2 * | 11/2003 | Branch et al. ............... 331/57 |
| 6,654,638 | B1 | 11/2003 | Sweeney |
| 6,663,846 | B1 | 12/2003 | McCombs |
| 6,673,474 | B2 | 1/2004 | Yamamoto |
| 6,680,923 | B1 | 1/2004 | Leon |
| 6,689,117 | B2 | 2/2004 | Sweeney et al. |
| 6,694,161 | B2 | 2/2004 | Mehrotra |
| 6,704,602 | B2 | 3/2004 | Berg et al. |
| 6,720,923 | B1 | 4/2004 | Hayward et al. |
| 6,738,671 | B2 | 5/2004 | Christophersom et al. |
| 6,740,033 | B1 | 5/2004 | Olejniczak et al. |
| 6,745,082 | B2 | 6/2004 | Axelgaard et al. |
| 6,755,783 | B2 | 6/2004 | Cosentino |
| 6,757,523 | B2 | 6/2004 | Fry |
| 6,800,060 | B2 | 10/2004 | Marshall |
| 6,801,137 | B2 | 10/2004 | Eggers et al. |
| 6,822,554 | B2 | 11/2004 | Vrijens et al. |
| 6,836,862 | B1 | 12/2004 | Erekson et al. |
| 6,839,659 | B2 | 1/2005 | Tarassenko et al. |
| 6,840,904 | B2 | 1/2005 | Goldberg |
| 6,842,636 | B2 | 1/2005 | Perrault |
| 6,845,272 | B1 | 1/2005 | Thomsen |
| 6,864,780 | B2 | 3/2005 | Doi |
| 6,868,911 | B1 * | 3/2005 | Jacobson et al. ............... 166/369 |
| 6,879,810 | B2 | 4/2005 | Bouet |
| 6,909,878 | B2 | 6/2005 | Haller |
| 6,922,592 | B2 | 7/2005 | Thompson et al. |
| 6,928,370 | B2 | 8/2005 | Anuzis et al. |
| 6,929,636 | B1 | 8/2005 | von Alten |
| 6,937,150 | B2 | 8/2005 | Medema |
| 6,942,616 | B2 | 9/2005 | Kerr |
| 6,951,536 | B2 | 10/2005 | Yokoi |
| 6,957,107 | B2 | 10/2005 | Rogers et al. |
| 6,968,153 | B1 | 11/2005 | Heinonen |
| 6,987,965 | B1 | 1/2006 | Ng et al. |
| 6,990,082 | B1 | 1/2006 | Zehavi et al. |
| 7,002,476 | B2 | 2/2006 | Rapchak |
| 7,004,395 | B2 | 2/2006 | Koenck |
| 7,009,634 | B2 | 3/2006 | Iddan et al. |
| 7,009,946 | B1 | 3/2006 | Kardach |
| 7,013,162 | B2 | 3/2006 | Gorsuch |
| 7,016,648 | B2 | 3/2006 | Haller |
| 7,020,508 | B2 | 3/2006 | Stivoric |
| 7,024,248 | B2 | 4/2006 | Penner et al. |
| 7,031,745 | B2 | 4/2006 | Shen |
| 7,031,857 | B2 | 4/2006 | Tarassenko et al. |
| 7,039,453 | B2 | 5/2006 | Mullick |
| 7,046,649 | B2 | 5/2006 | Awater et al. |
| 7,118,531 | B2 | 10/2006 | Krill |
| 7,127,300 | B2 | 10/2006 | Mazar et al. |
| 7,146,228 | B2 | 12/2006 | Nielsen |
| 7,146,449 | B2 | 12/2006 | Do et al. |
| 7,149,581 | B2 | 12/2006 | Goedeke et al. |
| 7,154,071 | B2 | 12/2006 | Sattler et al. |
| 7,155,232 | B2 | 12/2006 | Godfrey et al. |
| 7,160,258 | B2 | 1/2007 | Imran |
| 7,164,942 | B2 | 1/2007 | Avrahami |
| 7,171,166 | B2 | 1/2007 | Ng et al. |
| 7,171,177 | B2 | 1/2007 | Park et al. |
| 7,171,259 | B2 | 1/2007 | Rytky |
| 7,187,960 | B2 | 3/2007 | Abreu |
| 7,188,767 | B2 | 3/2007 | Penuela |
| 7,194,038 | B1 | 3/2007 | Inkinen |
| 7,206,630 | B1 | 4/2007 | Tarler |
| 7,209,790 | B2 | 4/2007 | Thompson et al. |
| 7,215,660 | B2 | 5/2007 | Perlman |
| 7,215,991 | B2 | 5/2007 | Besson |
| 7,218,967 | B2 | 5/2007 | Bergelson |
| 7,231,451 | B2 | 6/2007 | Law |
| 7,243,118 | B2 | 7/2007 | Lou |

| Patent/Publication | Date | Name |
|---|---|---|
| 7,246,521 B2 | 7/2007 | Kim |
| 7,249,212 B2 | 7/2007 | Do |
| 7,252,792 B2 | 8/2007 | Perrault |
| 7,253,716 B2 | 8/2007 | Lovoi et al. |
| 7,261,690 B2 | 8/2007 | Teller |
| 7,270,633 B1 | 9/2007 | Goscha |
| 7,273,454 B2 | 9/2007 | Raymond et al. |
| 7,289,855 B2 | 10/2007 | Nghiem |
| 7,291,497 B2 | 11/2007 | Holmes |
| 7,292,139 B2 | 11/2007 | Mazar et al. |
| 7,294,105 B1 | 11/2007 | Islam |
| 7,313,163 B2 | 12/2007 | Liu |
| 7,317,378 B2 | 1/2008 | Jarvis et al. |
| 7,318,808 B2 | 1/2008 | Tarassenko et al. |
| 7,336,929 B2 | 2/2008 | Yasuda |
| 7,342,895 B2 | 3/2008 | Serpa |
| 7,346,380 B2 | 3/2008 | Axelgaard et al. |
| 7,349,722 B2 | 3/2008 | Witkowski et al. |
| 7,352,998 B2 | 4/2008 | Palin |
| 7,353,258 B2 | 4/2008 | Washburn |
| 7,357,891 B2 | 4/2008 | Yang et al. |
| 7,359,674 B2 | 4/2008 | Markki |
| 7,366,558 B2 | 4/2008 | Virtanen et al. |
| 7,373,196 B2 | 5/2008 | Ryu et al. |
| 7,375,739 B2 | 5/2008 | Robbins |
| 7,376,435 B2 | 5/2008 | McGowan |
| 7,382,263 B2 | 6/2008 | Danowski et al. |
| 7,387,607 B2 | 6/2008 | Holt |
| 7,388,903 B2 | 6/2008 | Godfrey et al. |
| 7,389,088 B2 | 6/2008 | Kim |
| 7,392,015 B1 | 6/2008 | Farlow |
| 7,395,106 B2 | 7/2008 | Ryu et al. |
| 7,396,330 B2 | 7/2008 | Banet |
| 7,404,968 B2 | 7/2008 | Abrams et al. |
| 7,413,544 B2 | 8/2008 | Kerr |
| 7,414,534 B1 | 8/2008 | Kroll et al. |
| 7,415,242 B1 | 8/2008 | Ngan |
| 7,424,268 B2 | 9/2008 | Diener |
| 7,424,319 B2 | 9/2008 | Muehlsteff |
| 7,427,266 B2 | 9/2008 | Ayer et al. |
| 7,471,665 B2 | 12/2008 | Perlman |
| 7,499,674 B2 | 3/2009 | Salokannel |
| 7,510,121 B2 | 3/2009 | Koenck |
| 7,512,448 B2 | 3/2009 | Malick |
| 7,515,043 B2 | 4/2009 | Welch |
| 7,523,756 B2 | 4/2009 | Minai |
| 7,525,426 B2 | 4/2009 | Edelstein |
| 7,539,533 B2 | 5/2009 | Tran |
| 7,542,878 B2 | 6/2009 | Nanikashvili |
| 7,551,590 B2 | 6/2009 | Haller |
| 7,554,452 B2 | 6/2009 | Cole |
| 7,575,005 B2 | 8/2009 | Mumford |
| 7,616,111 B2 | 11/2009 | Covannon |
| 7,617,001 B2 | 11/2009 | Penner et al. |
| 7,640,802 B2 | 1/2010 | King et al. |
| 7,647,112 B2 | 1/2010 | Tracey |
| 7,647,185 B2 | 1/2010 | Tarassenko et al. |
| 7,653,031 B2 | 1/2010 | Godfrey et al. |
| 7,672,714 B2 | 3/2010 | Kuo |
| 7,673,679 B2 | 3/2010 | Harrison et al. |
| 7,678,043 B2 | 3/2010 | Gilad |
| 7,697,994 B2 | 4/2010 | VanDanacker et al. |
| 7,720,036 B2 | 5/2010 | Sadri |
| 7,729,776 B2 | 6/2010 | Von Arx et al. |
| 7,733,224 B2 | 6/2010 | Tran |
| 7,736,318 B2 | 6/2010 | Costentino |
| 7,756,587 B2 | 7/2010 | Penner et al. |
| 7,809,399 B2 | 10/2010 | Lu |
| 7,844,341 B2 | 11/2010 | Von Arx et al. |
| 2001/0027331 A1 | 10/2001 | Thompson |
| 2001/0044588 A1 | 11/2001 | Mault |
| 2001/0051766 A1 | 12/2001 | Gazdzinski et al. |
| 2002/0002326 A1 | 1/2002 | Causey et al. |
| 2002/0026111 A1 | 2/2002 | Ackerman |
| 2002/0040278 A1 | 4/2002 | Anuzis et al. |
| 2002/0077620 A1 | 6/2002 | Sweeney et al. |
| 2002/0099310 A1 * | 7/2002 | Kimchy et al. ............ 600/587 |
| 2002/0132226 A1 | 9/2002 | Nair |
| 2003/0017826 A1 | 1/2003 | Fishman |
| 2003/0023150 A1 | 1/2003 | Yokoi et al. |
| 2003/0028226 A1 | 2/2003 | Thompson |
| 2003/0065536 A1 | 4/2003 | Hansen |
| 2003/0076179 A1 | 4/2003 | Branch et al. |
| 2003/0083559 A1 | 5/2003 | Thompson |
| 2003/0126593 A1 | 7/2003 | Mault |
| 2003/0130714 A1 | 7/2003 | Nielsen et al. |
| 2003/0135128 A1 | 7/2003 | Suffin et al. |
| 2003/0135392 A1 | 7/2003 | Vrijens et al. |
| 2003/0152622 A1 | 8/2003 | Louie-Helm et al. |
| 2003/0158466 A1 | 8/2003 | Lynn et al. |
| 2003/0158756 A1 | 8/2003 | Abramson |
| 2003/0162556 A1 | 8/2003 | Libes |
| 2003/0167000 A1 | 9/2003 | Mullick et al. |
| 2003/0171791 A1 | 9/2003 | KenKnight |
| 2003/0171898 A1 | 9/2003 | Tarassenko et al. |
| 2003/0181788 A1 | 9/2003 | Yokoi et al. |
| 2003/0185286 A1 | 10/2003 | Yuen |
| 2003/0187337 A1 | 10/2003 | Tarassenko et al. |
| 2003/0187338 A1 | 10/2003 | Say et al. |
| 2003/0195403 A1 | 10/2003 | Berner et al. |
| 2003/0213495 A1 | 11/2003 | Fujita et al. |
| 2003/0214579 A1 | 11/2003 | Iddan |
| 2003/0216622 A1 | 11/2003 | Meron et al. |
| 2003/0216625 A1 | 11/2003 | Phipps |
| 2003/0216666 A1 | 11/2003 | Ericson et al. |
| 2003/0216729 A1 | 11/2003 | Marchitto |
| 2004/0008123 A1 | 1/2004 | Carrender et al. |
| 2004/0018476 A1 | 1/2004 | LaDue |
| 2004/0034295 A1 | 2/2004 | Salganicoff |
| 2004/0049245 A1 | 3/2004 | Gass |
| 2004/0073095 A1 | 4/2004 | Causey et al. |
| 2004/0073454 A1 | 4/2004 | Urquhart et al. |
| 2004/0077995 A1 | 4/2004 | Ferek-Petric |
| 2004/0082982 A1 | 4/2004 | Gord et al. |
| 2004/0087839 A1 | 5/2004 | Raymond et al. |
| 2004/0092801 A1 | 5/2004 | Drakulic |
| 2004/0106859 A1 | 6/2004 | Say et al. |
| 2004/0115517 A1 | 6/2004 | Fukuda et al. |
| 2004/0121015 A1 | 6/2004 | Chidlaw et al. |
| 2004/0148140 A1 | 7/2004 | Tarassenko et al. |
| 2004/0153007 A1 | 8/2004 | Harris |
| 2004/0167226 A1 | 8/2004 | Serafini |
| 2004/0167801 A1 | 8/2004 | Say et al. |
| 2004/0193020 A1 | 9/2004 | Chiba |
| 2004/0193029 A1 | 9/2004 | Glukhovsky |
| 2004/0193446 A1 | 9/2004 | Mayer et al. |
| 2004/0199222 A1 | 10/2004 | Sun et al. |
| 2004/0215084 A1 | 10/2004 | Shimizu et al. |
| 2004/0218683 A1 | 11/2004 | Batra |
| 2004/0220643 A1 | 11/2004 | Schmidt |
| 2004/0224644 A1 | 11/2004 | Wu |
| 2004/0225199 A1 | 11/2004 | Evanyk |
| 2004/0253304 A1 | 12/2004 | Gross et al. |
| 2004/0260154 A1 | 12/2004 | Sidelnik |
| 2005/0017841 A1 | 1/2005 | Doi |
| 2005/0020887 A1 | 1/2005 | Goldberg |
| 2005/0021370 A1 | 1/2005 | Riff |
| 2005/0024198 A1 | 2/2005 | Ward |
| 2005/0027205 A1 | 2/2005 | Tarassenko et al. |
| 2005/0038321 A1 | 2/2005 | Fujita et al. |
| 2005/0043634 A1 | 2/2005 | Yokoi et al. |
| 2005/0062644 A1 | 3/2005 | Leci |
| 2005/0065407 A1 | 3/2005 | Nakamura et al. |
| 2005/0070778 A1 | 3/2005 | Lackey |
| 2005/0092108 A1 | 5/2005 | Andermo |
| 2005/0096514 A1 | 5/2005 | Starkebaum |
| 2005/0096562 A1 | 5/2005 | Delalic et al. |
| 2005/0101843 A1 | 5/2005 | Quinn |
| 2005/0101872 A1 | 5/2005 | Sattler |
| 2005/0115561 A1 | 6/2005 | Stahmann et al. |
| 2005/0116820 A1 | 6/2005 | Goldreich |
| 2005/0117389 A1 | 6/2005 | Worledge |
| 2005/0121322 A1 | 6/2005 | Say et al. |
| 2005/0131281 A1 | 6/2005 | Ayer et al. |
| 2005/0143623 A1 | 6/2005 | Kojima |
| 2005/0148883 A1 | 7/2005 | Boesen |
| 2005/0154428 A1 | 7/2005 | Bruinsma |
| 2005/0165323 A1 | 7/2005 | Montgomery |

| | | |
|---|---|---|
| 2005/0177069 A1 | 8/2005 | Takizawa |
| 2005/0182389 A1 | 8/2005 | LaPorte |
| 2005/0187789 A1 | 8/2005 | Hatlestad et al. |
| 2005/0192489 A1 | 9/2005 | Marshall |
| 2005/0197680 A1 | 9/2005 | DelMain et al. |
| 2005/0228268 A1 | 10/2005 | Cole |
| 2005/0234307 A1 | 10/2005 | Heinonen |
| 2005/0240305 A1 | 10/2005 | Bogash et al. |
| 2005/0245794 A1 | 11/2005 | Dinsmoor |
| 2005/0253660 A1* | 11/2005 | Shi et al. .................. 331/57 |
| 2005/0259768 A1 | 11/2005 | Yang et al. |
| 2005/0261559 A1 | 11/2005 | Mumford |
| 2005/0267556 A1 | 12/2005 | Shuros et al. |
| 2005/0267756 A1 | 12/2005 | Schultz et al. |
| 2005/0277912 A1 | 12/2005 | John |
| 2005/0277999 A1 | 12/2005 | Strother et al. |
| 2005/0285746 A1 | 12/2005 | Sengupta |
| 2005/0288594 A1 | 12/2005 | Lewkowicz et al. |
| 2006/0001496 A1 | 1/2006 | Abrosimov et al. |
| 2006/0036134 A1 | 2/2006 | Tarassenko et al. |
| 2006/0061472 A1 | 3/2006 | Lovoi et al. |
| 2006/0065713 A1 | 3/2006 | Kingery |
| 2006/0074283 A1 | 4/2006 | Henderson |
| 2006/0078765 A1 | 4/2006 | Yang et al. |
| 2006/0095091 A1 | 5/2006 | Drew |
| 2006/0095093 A1 | 5/2006 | Bettesh et al. |
| 2006/0100533 A1 | 5/2006 | Han |
| 2006/0109058 A1 | 5/2006 | Keating |
| 2006/0110962 A1 | 5/2006 | Powell |
| 2006/0122667 A1 | 6/2006 | Chavan et al. |
| 2006/0136266 A1 | 6/2006 | Tarassenko et al. |
| 2006/0142648 A1 | 6/2006 | Banet |
| 2006/0145876 A1 | 7/2006 | Kimura |
| 2006/0148254 A1 | 7/2006 | McLean |
| 2006/0149339 A1 | 7/2006 | Burnes |
| 2006/0155174 A1 | 7/2006 | Glukhovsky et al. |
| 2006/0155183 A1 | 7/2006 | Kroecker |
| 2006/0161225 A1 | 7/2006 | Sormann et al. |
| 2006/0179949 A1 | 8/2006 | Kim |
| 2006/0183993 A1 | 8/2006 | Horn |
| 2006/0184092 A1 | 8/2006 | Atanasoska et al. |
| 2006/0204738 A1 | 9/2006 | Dubrow et al. |
| 2006/0210626 A1 | 9/2006 | Spaeder |
| 2006/0216603 A1 | 9/2006 | Choi |
| 2006/0218011 A1 | 9/2006 | Walker |
| 2006/0235489 A1 | 10/2006 | Drew |
| 2006/0247505 A1 | 11/2006 | Siddiqui |
| 2006/0253005 A1 | 11/2006 | Drinan |
| 2006/0270346 A1 | 11/2006 | Ibrahim |
| 2006/0280227 A1 | 12/2006 | Pinkney |
| 2006/0282001 A1 | 12/2006 | Noel |
| 2006/0289640 A1 | 12/2006 | Mercure |
| 2006/0293607 A1 | 12/2006 | Alt |
| 2007/0002038 A1 | 1/2007 | Suzuki |
| 2007/0006636 A1 | 1/2007 | King et al. |
| 2007/0008113 A1 | 1/2007 | Spoonhower et al. |
| 2007/0016089 A1 | 1/2007 | Fischell et al. |
| 2007/0027386 A1 | 2/2007 | Such |
| 2007/0027388 A1 | 2/2007 | Chou |
| 2007/0038054 A1 | 2/2007 | Zhou |
| 2007/0049339 A1 | 3/2007 | Barak et al. |
| 2007/0055098 A1 | 3/2007 | Shimizu et al. |
| 2007/0060797 A1 | 3/2007 | Ball |
| 2007/0073353 A1 | 3/2007 | Rooney et al. |
| 2007/0096765 A1 | 5/2007 | Kagan |
| 2007/0106346 A1 | 5/2007 | Bergelson |
| 2007/0123772 A1 | 5/2007 | Euliano |
| 2007/0129622 A1 | 6/2007 | Bourget |
| 2007/0130287 A1 | 6/2007 | Kumar |
| 2007/0135803 A1 | 6/2007 | Belson |
| 2007/0142721 A1 | 6/2007 | Berner et al. |
| 2007/0156016 A1 | 7/2007 | Betesh |
| 2007/0162089 A1 | 7/2007 | Mosesov |
| 2007/0162090 A1 | 7/2007 | Penner |
| 2007/0167495 A1 | 7/2007 | Brown et al. |
| 2007/0167848 A1 | 7/2007 | Kuo et al. |
| 2007/0173701 A1 | 7/2007 | Al-Ali |
| 2007/0179347 A1 | 8/2007 | Tarassenko et al. |
| 2007/0185393 A1 | 8/2007 | Zhou |
| 2007/0191002 A1 | 8/2007 | Ge |
| 2007/0196456 A1 | 8/2007 | Stevens |
| 2007/0207793 A1 | 9/2007 | Myer |
| 2007/0208233 A1 | 9/2007 | Kovacs |
| 2007/0213659 A1 | 9/2007 | Trovato et al. |
| 2007/0237719 A1 | 10/2007 | Jones |
| 2007/0244370 A1 | 10/2007 | Kuo et al. |
| 2007/0255198 A1 | 11/2007 | Leong et al. |
| 2007/0255330 A1 | 11/2007 | Lee |
| 2007/0270672 A1 | 11/2007 | Hayter |
| 2007/0279217 A1 | 12/2007 | Venkatraman |
| 2007/0282174 A1 | 12/2007 | Sabatino |
| 2007/0282177 A1 | 12/2007 | Pilz |
| 2007/0299480 A1 | 12/2007 | Hill |
| 2008/0014866 A1 | 1/2008 | Lipowski |
| 2008/0020037 A1 | 1/2008 | Robertson et al. |
| 2008/0021519 A1 | 1/2008 | DeGeest |
| 2008/0021521 A1 | 1/2008 | Shah |
| 2008/0027679 A1 | 1/2008 | Shklarski |
| 2008/0033273 A1 | 2/2008 | Zhou |
| 2008/0046038 A1 | 2/2008 | Hill |
| 2008/0051667 A1 | 2/2008 | Goldreich |
| 2008/0058614 A1 | 3/2008 | Banet |
| 2008/0062856 A1 | 3/2008 | Feher |
| 2008/0065168 A1 | 3/2008 | Bitton et al. |
| 2008/0074307 A1 | 3/2008 | Boric-Lubecke |
| 2008/0077015 A1 | 3/2008 | Boric-Lubecke |
| 2008/0077188 A1 | 3/2008 | Denker et al. |
| 2008/0091089 A1 | 4/2008 | Guillory et al. |
| 2008/0091114 A1 | 4/2008 | Min |
| 2008/0097549 A1 | 4/2008 | Colbaugh |
| 2008/0097917 A1 | 4/2008 | Dicks |
| 2008/0103440 A1 | 5/2008 | Ferren et al. |
| 2008/0114224 A1 | 5/2008 | Bandy et al. |
| 2008/0119705 A1 | 5/2008 | Patel |
| 2008/0119716 A1 | 5/2008 | Boric-Lubecke |
| 2008/0137566 A1 | 6/2008 | Marholev |
| 2008/0140403 A1 | 6/2008 | Hughes et al. |
| 2008/0146871 A1 | 6/2008 | Arneson et al. |
| 2008/0146889 A1 | 6/2008 | Young |
| 2008/0146892 A1 | 6/2008 | LeBoeuf |
| 2008/0154104 A1 | 6/2008 | Lamego |
| 2008/0166992 A1 | 7/2008 | Ricordi |
| 2008/0183245 A1 | 7/2008 | Van Oort |
| 2008/0188837 A1 | 8/2008 | Belsky et al. |
| 2008/0194912 A1 | 8/2008 | Trovato et al. |
| 2008/0208009 A1 | 8/2008 | Shklarski |
| 2008/0214901 A1 | 9/2008 | Gehman |
| 2008/0214985 A1 | 9/2008 | Yanaki |
| 2008/0243020 A1 | 10/2008 | Chou |
| 2008/0249360 A1 | 10/2008 | Li |
| 2008/0262320 A1 | 10/2008 | Schaefer et al. |
| 2008/0262336 A1 | 10/2008 | Ryu |
| 2008/0269664 A1 | 10/2008 | Trovato et al. |
| 2008/0275312 A1 | 11/2008 | Mosesov |
| 2008/0284599 A1 | 11/2008 | Zdeblick et al. |
| 2008/0288027 A1 | 11/2008 | Kroll |
| 2008/0294020 A1 | 11/2008 | Sapounas |
| 2008/0300572 A1 | 12/2008 | Rankers |
| 2008/0303638 A1 | 12/2008 | Nguyen |
| 2008/0306357 A1 | 12/2008 | Korman |
| 2008/0306359 A1 | 12/2008 | Zdeblick et al. |
| 2008/0306360 A1 | 12/2008 | Robertson et al. |
| 2008/0311852 A1 | 12/2008 | Hansen |
| 2008/0312522 A1 | 12/2008 | Rowlandson |
| 2008/0316020 A1 | 12/2008 | Robertson |
| 2009/0009332 A1 | 1/2009 | Nunez et al. |
| 2009/0024045 A1 | 1/2009 | Prakash |
| 2009/0030297 A1 | 1/2009 | Miller |
| 2009/0034209 A1 | 2/2009 | Joo |
| 2009/0043171 A1 | 2/2009 | Rule |
| 2009/0048498 A1 | 2/2009 | Riskey |
| 2009/0062634 A1 | 3/2009 | Say et al. |
| 2009/0062670 A1 | 3/2009 | Sterling |
| 2009/0069642 A1 | 3/2009 | Gao |
| 2009/0069655 A1 | 3/2009 | Say et al. |
| 2009/0069656 A1 | 3/2009 | Say et al. |
| 2009/0069657 A1 | 3/2009 | Say et al. |
| 2009/0069658 A1 | 3/2009 | Say et al. |

| Publication No. | Date | Name |
|---|---|---|
| 2009/0076343 A1 | 3/2009 | James |
| 2009/0082645 A1 | 3/2009 | Hafezi et al. |
| 2009/0088618 A1 | 4/2009 | Ameson |
| 2009/0099435 A1 | 4/2009 | Say et al. |
| 2009/0110148 A1 | 4/2009 | Zhang |
| 2009/0112626 A1 | 4/2009 | Talbot |
| 2009/0124871 A1 | 5/2009 | Arshak |
| 2009/0131774 A1 | 5/2009 | Sweitzer |
| 2009/0135886 A1 | 5/2009 | Robertson et al. |
| 2009/0157113 A1 | 6/2009 | Marcotte |
| 2009/0157358 A1 | 6/2009 | Kim |
| 2009/0161602 A1 | 6/2009 | Matsumoto |
| 2009/0163789 A1 | 6/2009 | Say et al. |
| 2009/0171180 A1 | 7/2009 | Pering |
| 2009/0173628 A1 | 7/2009 | Say et al. |
| 2009/0177055 A1 | 7/2009 | Say et al. |
| 2009/0177056 A1 | 7/2009 | Say et al. |
| 2009/0177057 A1 | 7/2009 | Say et al. |
| 2009/0177058 A1 | 7/2009 | Say et al. |
| 2009/0177059 A1 | 7/2009 | Say et al. |
| 2009/0177060 A1 | 7/2009 | Say et al. |
| 2009/0177061 A1 | 7/2009 | Say et al. |
| 2009/0177062 A1 | 7/2009 | Say et al. |
| 2009/0177063 A1 | 7/2009 | Say et al. |
| 2009/0177064 A1 | 7/2009 | Say et al. |
| 2009/0177065 A1 | 7/2009 | Say et al. |
| 2009/0177066 A1 | 7/2009 | Say et al. |
| 2009/0182206 A1 | 7/2009 | Najafi |
| 2009/0182212 A1 | 7/2009 | Say et al. |
| 2009/0182213 A1 | 7/2009 | Say et al. |
| 2009/0182214 A1 | 7/2009 | Say et al. |
| 2009/0182215 A1 | 7/2009 | Say et al. |
| 2009/0182388 A1 | 7/2009 | Von Arx |
| 2009/0187088 A1 | 7/2009 | Say et al. |
| 2009/0187089 A1 | 7/2009 | Say et al. |
| 2009/0187090 A1 | 7/2009 | Say et al. |
| 2009/0187091 A1 | 7/2009 | Say et al. |
| 2009/0187092 A1 | 7/2009 | Say et al. |
| 2009/0187093 A1 | 7/2009 | Say et al. |
| 2009/0187094 A1 | 7/2009 | Say et al. |
| 2009/0187095 A1 | 7/2009 | Say et al. |
| 2009/0187381 A1 | 7/2009 | King et al. |
| 2009/0192351 A1 | 7/2009 | Nishino |
| 2009/0192368 A1 | 7/2009 | Say et al. |
| 2009/0192369 A1 | 7/2009 | Say et al. |
| 2009/0192370 A1 | 7/2009 | Say et al. |
| 2009/0192371 A1 | 7/2009 | Say et al. |
| 2009/0192372 A1 | 7/2009 | Say et al. |
| 2009/0192373 A1 | 7/2009 | Say et al. |
| 2009/0192374 A1 | 7/2009 | Say et al. |
| 2009/0192375 A1 | 7/2009 | Say et al. |
| 2009/0192376 A1 | 7/2009 | Say et al. |
| 2009/0192377 A1 | 7/2009 | Say et al. |
| 2009/0192378 A1 | 7/2009 | Say et al. |
| 2009/0192379 A1 | 7/2009 | Say et al. |
| 2009/0198115 A1 | 8/2009 | Say et al. |
| 2009/0198116 A1 | 8/2009 | Say et al. |
| 2009/0198175 A1 | 8/2009 | Say et al. |
| 2009/0203964 A1 | 8/2009 | Shimizu et al. |
| 2009/0203971 A1 | 8/2009 | Sciarappa |
| 2009/0203972 A1 | 8/2009 | Heneghan |
| 2009/0203978 A1 | 8/2009 | Say et al. |
| 2009/0204265 A1 | 8/2009 | Hackett |
| 2009/0210164 A1 | 8/2009 | Say et al. |
| 2009/0216101 A1 | 8/2009 | Say et al. |
| 2009/0216102 A1 | 8/2009 | Say et al. |
| 2009/0227204 A1 | 9/2009 | Robertson et al. |
| 2009/0227876 A1 | 9/2009 | Tran |
| 2009/0227940 A1 | 9/2009 | Say et al. |
| 2009/0227941 A1 | 9/2009 | Say et al. |
| 2009/0228214 A1 | 9/2009 | Say et al. |
| 2009/0231125 A1 | 9/2009 | Baldus |
| 2009/0234200 A1 | 9/2009 | Husheer |
| 2009/0243833 A1 | 10/2009 | Huang |
| 2009/0253960 A1 | 10/2009 | Takenaka et al. |
| 2009/0256702 A1 | 10/2009 | Robertson |
| 2009/0264714 A1 | 10/2009 | Chou |
| 2009/0264964 A1 | 10/2009 | Abrahamson |
| 2009/0265186 A1 | 10/2009 | Tarassenko et al. |
| 2009/0273467 A1 | 11/2009 | Elixmann |
| 2009/0281539 A1 | 11/2009 | Selig |
| 2009/0295548 A1 | 12/2009 | Ronkka |
| 2009/0296677 A1 | 12/2009 | Mahany |
| 2009/0303920 A1 | 12/2009 | Mahany |
| 2009/0312619 A1 | 12/2009 | Say et al. |
| 2009/0318761 A1 | 12/2009 | Rabinovitz |
| 2009/0318779 A1 | 12/2009 | Tran |
| 2009/0318783 A1 | 12/2009 | Rohde |
| 2009/0318793 A1 | 12/2009 | Datta |
| 2010/0010330 A1 | 1/2010 | Rankers |
| 2010/0049006 A1 | 2/2010 | Magar |
| 2010/0049012 A1 | 2/2010 | Dijksman et al. |
| 2010/0049069 A1 | 2/2010 | Tarassenko et al. |
| 2010/0056878 A1 | 3/2010 | Partin |
| 2010/0056891 A1 | 3/2010 | Say et al. |
| 2010/0056939 A1 | 3/2010 | Tarassenko et al. |
| 2010/0057041 A1 | 3/2010 | Hayter |
| 2010/0062709 A1 | 3/2010 | Kato |
| 2010/0063438 A1 | 3/2010 | Bengtsson |
| 2010/0063841 A1 | 3/2010 | D'Ambrosia et al. |
| 2010/0069002 A1 | 3/2010 | Rong |
| 2010/0099967 A1 | 4/2010 | Say et al. |
| 2010/0099968 A1 | 4/2010 | Say et al. |
| 2010/0099969 A1 | 4/2010 | Say et al. |
| 2010/0100077 A1 | 4/2010 | Rush |
| 2010/0100078 A1 | 4/2010 | Say et al. |
| 2010/0106001 A1 | 4/2010 | Say et al. |
| 2010/0118853 A1 | 5/2010 | Godfrey |
| 2010/0139672 A1 | 6/2010 | Kroll et al. |
| 2010/0168659 A1 | 7/2010 | Say et al. |
| 2010/0179398 A1 | 7/2010 | Say et al. |
| 2010/0185055 A1 | 7/2010 | Robertson |
| 2010/0191073 A1 | 7/2010 | Tarassenko et al. |
| 2010/0210299 A1 | 8/2010 | Gorbachov |
| 2010/0222652 A1 | 9/2010 | Cho |
| 2010/0228113 A1 | 9/2010 | Solosko |
| 2010/0234706 A1 | 9/2010 | Gilland |
| 2010/0234715 A1 | 9/2010 | Shin |
| 2010/0234914 A1 | 9/2010 | Shen |
| 2010/0245091 A1 | 9/2010 | Singh |
| 2010/0249881 A1 | 9/2010 | Corndorf |
| 2010/0256461 A1 | 10/2010 | Mohamedali |
| 2010/0259543 A1 | 10/2010 | Tarassenko et al. |
| 2010/0268048 A1 | 10/2010 | Say et al. |
| 2010/0268049 A1 | 10/2010 | Say et al. |
| 2010/0268050 A1 | 10/2010 | Say et al. |
| 2010/0274111 A1 | 10/2010 | Say et al. |
| 2010/0280345 A1 | 11/2010 | Say et al. |
| 2010/0280346 A1 | 11/2010 | Say et al. |
| 2010/0298730 A1 | 11/2010 | Tarassenko et al. |
| 2010/0312580 A1 | 12/2010 | Tarassenko et al. |

FOREIGN PATENT DOCUMENTS

| | | |
|---|---|---|
| EP | 2143369 | 1/2010 |
| WO | 8802237 | 4/1988 |
| WO | WO8802237 | 4/1988 |
| WO | WO9308734 | 5/1993 |
| WO | WO9319667 | 10/1993 |
| WO | WO9843537 | 10/1998 |
| WO | WO9959465 | 11/1999 |
| WO | WO0033246 | 6/2000 |
| WO | WO0100085 | 1/2001 |
| WO | 01/47466 | 7/2001 |
| WO | WO0174011 | 10/2001 |
| WO | WO0180731 | 11/2001 |
| WO | WO0245489 | 6/2002 |
| WO | WO02058330 | 7/2002 |
| WO | WO02062276 | 8/2002 |
| WO | WO02087681 | 11/2002 |
| WO | WO03050643 | 6/2003 |
| WO | WO2004014225 | 2/2004 |
| WO | WO2004039256 | 5/2004 |
| WO | WO2004066834 | 8/2004 |
| WO | WO2004068881 | 8/2004 |
| WO | WO2004109316 | 12/2004 |
| WO | WO2005011237 | 2/2005 |
| WO | 2005/020023 | 3/2005 |
| WO | WO2005024687 | 3/2005 |

| | | |
|---|---|---|
| WO | WO2005047837 | 5/2005 |
| WO | WO2005051166 | 6/2005 |
| WO | WO2005110238 | 11/2005 |
| WO | WO2006027586 | 3/2006 |
| WO | 2006/055892 | 5/2006 |
| WO | 2006/055956 | 5/2006 |
| WO | WO2006075016 | 7/2006 |
| WO | WO2006100620 | 9/2006 |
| WO | 2006/104843 | 10/2006 |
| WO | 2006/116718 | 11/2006 |
| WO | 2006/127355 | 11/2006 |
| WO | 2007/001724 | 1/2007 |
| WO | 2007/001742 | 1/2007 |
| WO | 2007/013952 | 2/2007 |
| WO | 2007/021496 | 2/2007 |
| WO | WO2007014527 | 2/2007 |
| WO | 2007/027660 | 3/2007 |
| WO | 2007/028035 | 3/2007 |
| WO | WO2007028035 | 3/2007 |
| WO | 2007036741 | 4/2007 |
| WO | 2007036746 | 4/2007 |
| WO | WO2007036687 | 4/2007 |
| WO | WO2007036741 | 4/2007 |
| WO | WO2007036746 | 4/2007 |
| WO | WO2007040878 | 4/2007 |
| WO | WO2007071180 | 6/2007 |
| WO | WO2007096810 | 8/2007 |
| WO | WO2007101141 | 9/2007 |
| WO | WO2007120946 | 10/2007 |
| WO | 2007130491 | 11/2007 |
| WO | WO2007127316 | 11/2007 |
| WO | WO2007127879 | 11/2007 |
| WO | WO2007128165 | 11/2007 |
| WO | 2007/149546 | 12/2007 |
| WO | WO2007143535 | 12/2007 |
| WO | 2008/008281 | 1/2008 |
| WO | WO2008030482 | 3/2008 |
| WO | 2008/052136 | 5/2008 |
| WO | 2008/063626 | 5/2008 |
| WO | 2008/066617 | 6/2008 |
| WO | WO2008076464 | 6/2008 |
| WO | WO2008089232 | 7/2008 |
| WO | WO2008091683 | 7/2008 |
| WO | 2008/095183 | 8/2008 |
| WO | 2008/101107 | 8/2008 |
| WO | WO2008097652 | 8/2008 |
| WO | 2008/112577 | 9/2008 |
| WO | 2008/112578 | 9/2008 |
| WO | 2008120156 | 10/2008 |
| WO | WO2008133394 | 11/2008 |
| WO | WO2008134185 | 11/2008 |
| WO | 2009001108 | 12/2008 |
| WO | WO2008150633 | 12/2008 |
| WO | WO2009001108 | 12/2008 |
| WO | WO2009006615 | 1/2009 |
| WO | WO2009029453 | 3/2009 |
| WO | WO2009036334 | 3/2009 |
| WO | WO2009051829 | 4/2009 |
| WO | WO2009051830 | 4/2009 |
| WO | WO2009063377 | 5/2009 |
| WO | WO2009081348 | 7/2009 |
| WO | WO2009111664 | 9/2009 |
| WO | WO2009146082 | 12/2009 |
| WO | WO2010009100 | 1/2010 |
| WO | WO2010011833 | 1/2010 |
| WO | 2010019778 | 2/2010 |
| WO | 2010057049 | 5/2010 |
| WO | WO2010107563 | 9/2010 |
| WO | WO2010135516 | 11/2010 |

OTHER PUBLICATIONS

Philips Respironics (http/minimitter.com/products.cfm) Products, Noninvasive Technology To Help Your Studies Succeed. 510(k) Permanent Notification for Vital Sense. Apr. 22, 2004.
Aydin et al., "Design and implementation considerations for an advanced wireless interface in miniaturized integrated sensor Microsystems" Sch. of Eng. & Electron., Edinburgh Univ., UK; (2003); abstract.
Brock, "Smart Medicine: The Application of Auto-ID Technology to Healthcare" Auto-ID Labs (2002) http://www.autoidlabs.org/uploads/media/MIT-AUTOID-WH-010.pdf.
Heydari et al., Analysis of the PLL jitter due to power/ground and substrate noise. IEEE Transactions on Circuits and Systems 2004;51(12):2404-16.
Sanduleanu et al., Octave tunable, highly linear, RC-ring oscillator with differential fine-coarse tuning, quadrature outputs and amplitude control for fiber optic transceivers. 2002 IEEE MTT-S International Microwave Symposium Digest 2002;545-8.
Yang et al., Fast-switching frequency synthesizer with a discriminator-aided phase detector. IEEE Journal of Solid-State Circuits 2000;35(10):1445-52.
Gilson, D.R. "Molecular dynamics simulation of dipole interactions", Department of Physics, Hull University, p. 1-43, Dec. 2000.
Li, P-Y, et al. "An electrochemical intraocular drug delivery device", Sensors and Actuators A 143 p. 41-48, Jul. 2007.
Santini, J.T. et al, "Microchips as controlled drug delivery-devices", Agnew. Chem. Int. Ed. 2000, vol. 39, p. 2396-2407.
Shawgo, R.S. et al. "BioMEMS from drug delivery", Current Opinion in Solid State and Material Science 6 (2002), p. 329-334.
Tierney, M.J. et al "Electroreleasing Composite Membranes for Delivery of Insulin and other Biomacromolecules", J. Electrochem. Soc., vol. 137, No. 6, Jun. 1990, p. 2005-2006.
Description of ePatch Technology Platform for ECG and EMG, located it http://www.madebydelta.com/imported/images/DELTA_Web/documents/ME/ePatch_ECG_EMG.pdf, Dated Sep. 2, 2010.
Mackay et al., Radio telemetering from within the body: Inside information is revealed by tiny transmitters that can be swallowed or implanted in man or animal. Science 1961;134(3486):1196-1202.
Mackay et al,. Endoradiosonde, Nature 1957:179(4572):1239-40, 179.
Zworkin, A 'radio pill.' Nature 1957;179:898.
Yao et al., Low Power Digital Communication in implantable Devices Using Volume Conduction of Biological Tissues. Proceedings of the 28th IEEE, EMBC Annual International Conference 2006 (Aug. 30-Sep. 3); New York, USA.
McKenzie et al., Validation of a new telemetric core temperature monitor. J. Therm. Biol. 2004;29(7-8):605-11.
Tatbul et al., Confidence-based data management for personal area sensor networks. ACM International Conference Proceeding Series 2004;72.
Zimmerman, Personal Area Networks: Near-field intrabody communication. IBM Systems Journal 1996;35 (3-4):609-17.
Mini Mitter Co, Inc, 510(k) Premarket Notification Mini-Logger for Diagnostic Spirometer. Sep. 21, 1999.
Mini Mitter Co, Inc. 510(k) Premarket Notification for VitalSense. Apr. 22, 2004.
Mini Mitter Co, Inc. Actiheart. Traditional 510(k) Summary. Sep. 27, 2005.
Mini Mitter Co, Inc. VitalSense Integrated Physiological Monitoring System. Product Description.
Mini Mitter Co, Inc. VitalSense—Wireless Vital Signs Monitoring. Temperatures.com Mar. 31, 2009.
Mini Mitter Co, Inc. Noninvasive technology to help your studies succeed. Mini Mitter.com Mar. 31, 2009.
Barrie, Heidelberg pH capsule gastric analysis. Textbook of Natural Medicine, 1992, Pizzorno, Murray & Barrie.
Carlson et al., Evaluation of a non-invasive respiratory monitoring system for sleeping subjects. Physiological Measurement 1999;20(1):53.
Mojaverian et al., Estimation of gastric residence time of the Heidelberg capsule in humans: effect of varying food composition. Gastroenterology 1985;89(2):392-7.
Xiaoming et al., A telemedicine system for wireless home healthcare based on bluetooth and the internet. Telemedicine Journal and e-health 2004;10(S2):S110-6.

* cited by examiner

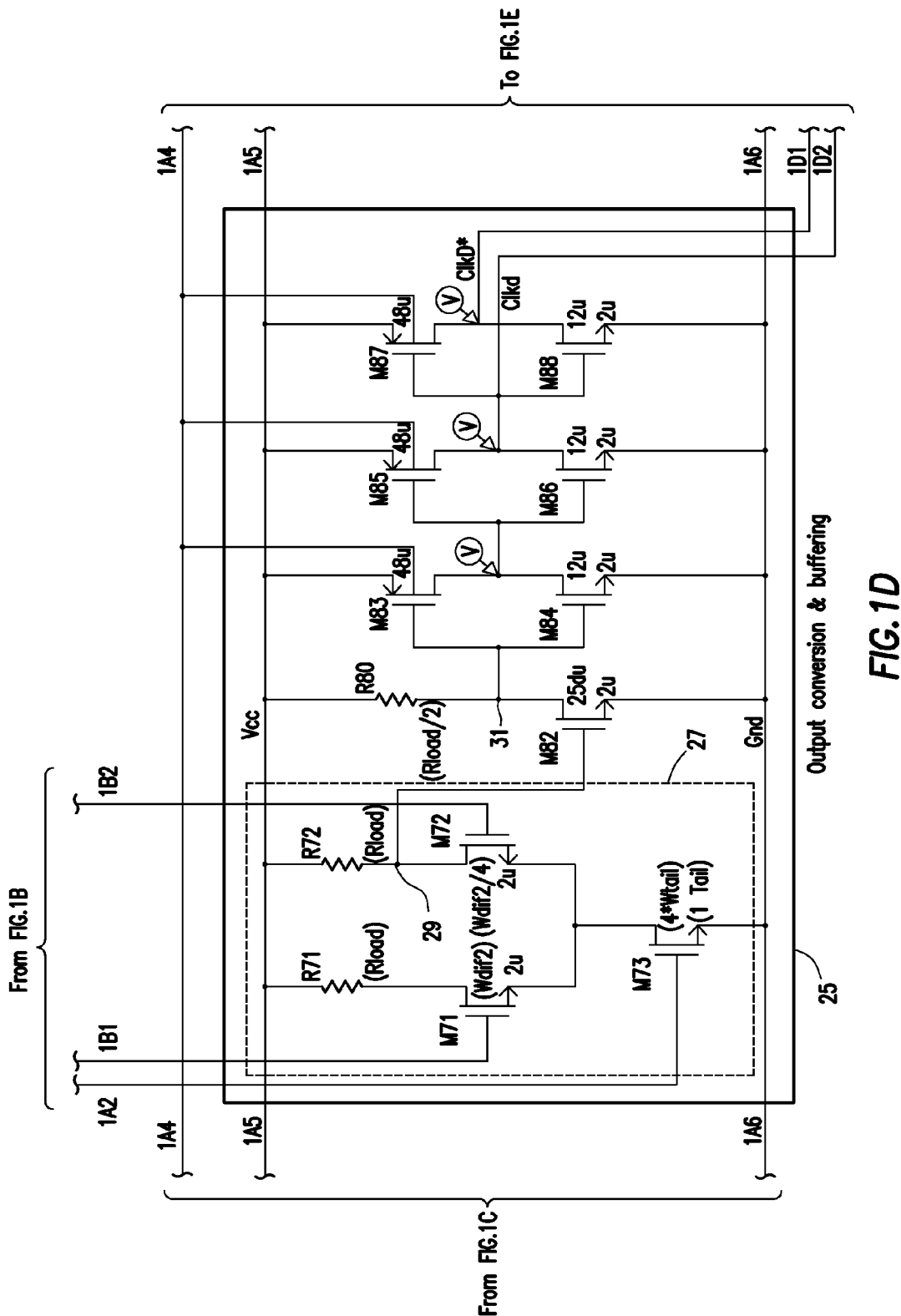

US 8,054,140 B2

LOW VOLTAGE OSCILLATOR FOR MEDICAL DEVICES

CROSS-REFERENCE TO RELATED APPLICATIONS

Pursuant to 35 U.S.C. §119 (e), this application claims priority to the filing date of: U.S. Provisional Patent Application Ser. No. 60/829,832 filed Oct. 17, 2006 the disclosure of which application is herein incorporated by reference.

INTRODUCTION

Oscillator circuits are used for many applications in electronic circuits, such as clock generation and signal transmission. It is often desired to have an oscillator which will run at low voltages and thus consume less power, in order to maximize battery life.

Sun et al., in U.S. Pat. No. 6,396,357, issued May 28, 2002, teach a voltage controlled oscillator for use in wireless communication devices, which utilizes a ring oscillator made up of differential amplifiers. The oscillator is designed to operate at voltages as low as 1.5 V, useful for conserving battery in applications such as cellular phones.

Cooper, in U.S. Pat. No. 5,552,751, issued Sep. 3, 1996, teaches an oscillator circuit having a voltage level shifting circuit with the ability to create a voltage drop of a predetermined amount across a differential transistor pair. This allows the circuit to use a voltage drop of as low as the larger of the two threshold voltages of the two transistors.

In *Design of Analog CMOS Integrated Circuits*, published in 2001, Razavi illustrates the use of a differential ring oscillator, in which a relatively low voltage swing for each stage is necessary to operate the oscillator. The minimum power supply voltage as they calculate it must be above the threshold voltage, plus the voltage across the current source, plus the equilibrium overdrive, plus half the voltage swing.

There are some applications where an oscillator must be run by a very small power source, such as in small ingestible applications. Often, the voltage supplied by the battery in these applications can vary. In applications which include signal transmission and receiving, frequency stability of the oscillator is highly desirable. It would therefore be desirable to have an oscillator which is small enough to be included in an ingestible circuit, is able to be operated by a battery supply which can vary from about 0.8 V to about 1.2 V, and which will output a relatively constant frequency independent of the supply voltage.

SUMMARY

The in-vivo low voltage oscillator provides an oscillator for clocking and signal transmission within the body, using very low supply voltage. It is implemented without the need for a mechanical resonator, e.g., a crystal oscillator. The in-vivo low voltage oscillator is designed to work with a battery that will provide a voltage of between about 0.8 V and 2.1V, such as 0.8V to 1.6 V, including from 0.8 V and 1.2 V. The in-vivo low voltage oscillator can function quite well at voltages above 1.2 V also, but its main advantage is in applications where battery voltage is at a premium, such as on small-scale chips which can be placed or ingested in the body. The in-vivo low voltage oscillator can function with a supply voltage of as small as about 0.8 V, while outputting a relatively stable frequency that does not change dramatically with varying supply voltage.

The low voltage oscillator of the invention finds use in a variety of different types of medical devices. Medical devices in which the low-voltage oscillator finds use include, but are not limited to: implantable medical devices, such as implantable pulse generators; ingestible event markers, including pharma-informatics enabled pharmaceutical compositions; parenteral fluid delivery systems, including in vivo and/or ex vivo components thereof; signal receivers configured to be in or on a body; etc.

In one embodiment of the in-vivo low voltage oscillator, the oscillator can contain a ring oscillator, which utilizes differential pairs and outputs an oscillating signal. The differential pairs can be biased in order to function at low voltages and provide a constant voltage swing from high to low across the differential pair, and a constant current through the tail, which are both independent of supply voltage.

In one embodiment of the in-vivo low voltage oscillator, the tail current is kept at a desirable and constant value by using a replica bias block which actively sets the voltages at the tail transistors. The replica bias block can utilize a differential pair which is set up in much the same way as the differential pairs in the ring oscillator block, and use a feedback loop to determine the proper voltage to apply to the tail transistors.

In one embodiment of the in-vivo low voltage oscillator, the constant voltage swing in the ring oscillator block is achieved by using a reference block. The reference block can produce a bias voltage which can be applied to one side of the differential pairs in the ring oscillator in order to bring the voltage on that side down by the amount of the bias voltage.

In one embodiment of the in-vivo low voltage oscillator, there is an output conversion and buffering block which can convert the output of the ring oscillator to a square wave that goes down to 0 V and up to the supply voltage. This is useful when the oscillator must be used with normal logic gates, which require a larger voltage swing. The output conversion and buffering block can create a square wave with short rise and fall times.

In one embodiment of the in-vivo low voltage oscillator, there is a toggle flip-flop block which decreases the frequency of the oscillating signal. This can be useful for reducing the frequency of the signal while using less circuit area than would be required to add more stages to the ring oscillator.

BRIEF DESCRIPTION OF THE FIGURES

FIGS. 1A-E is a circuit diagram of an embodiment of an in-vivo low voltage oscillator.

DETAILED DESCRIPTION

Figure 1A:
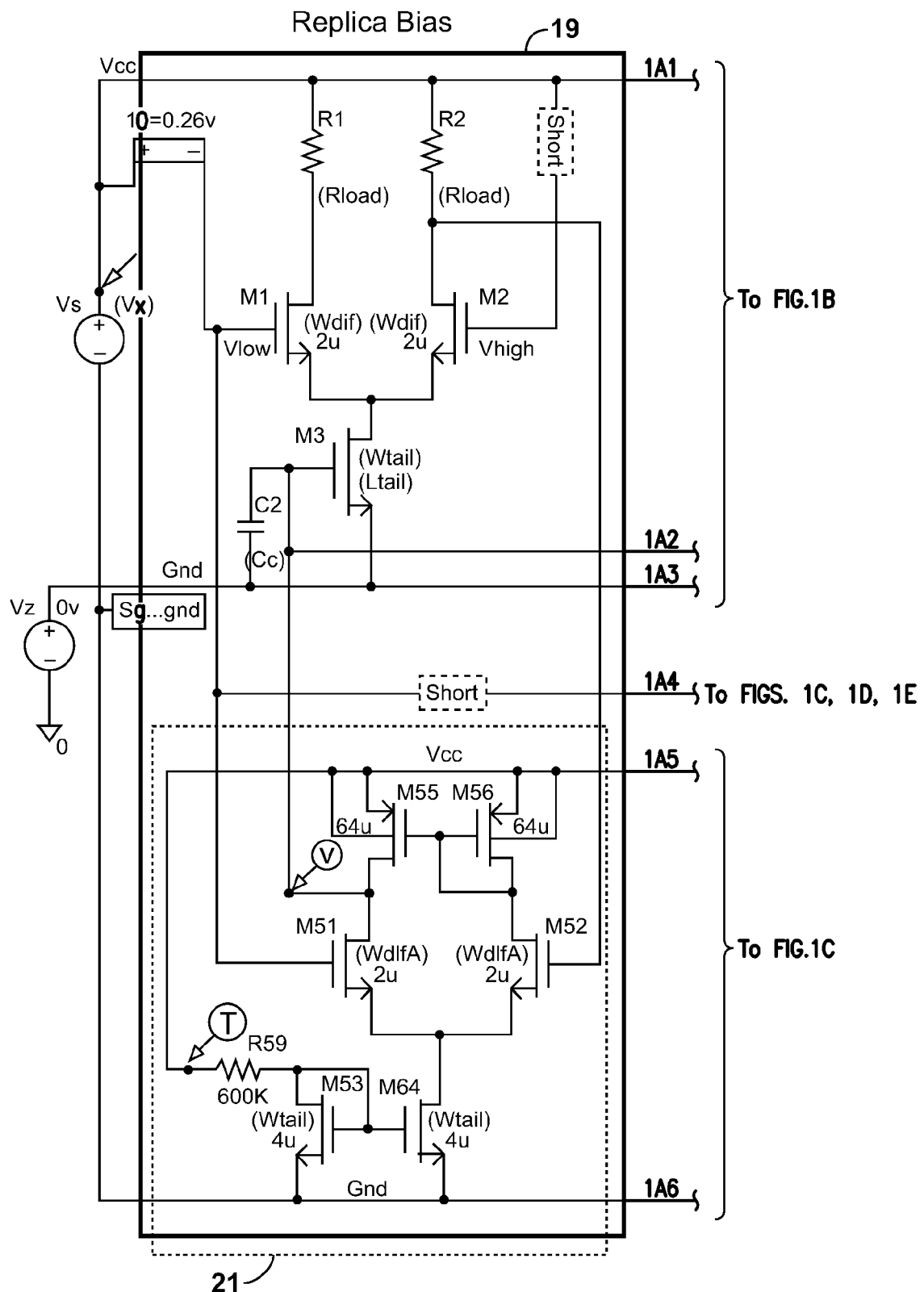
Figure 1B:
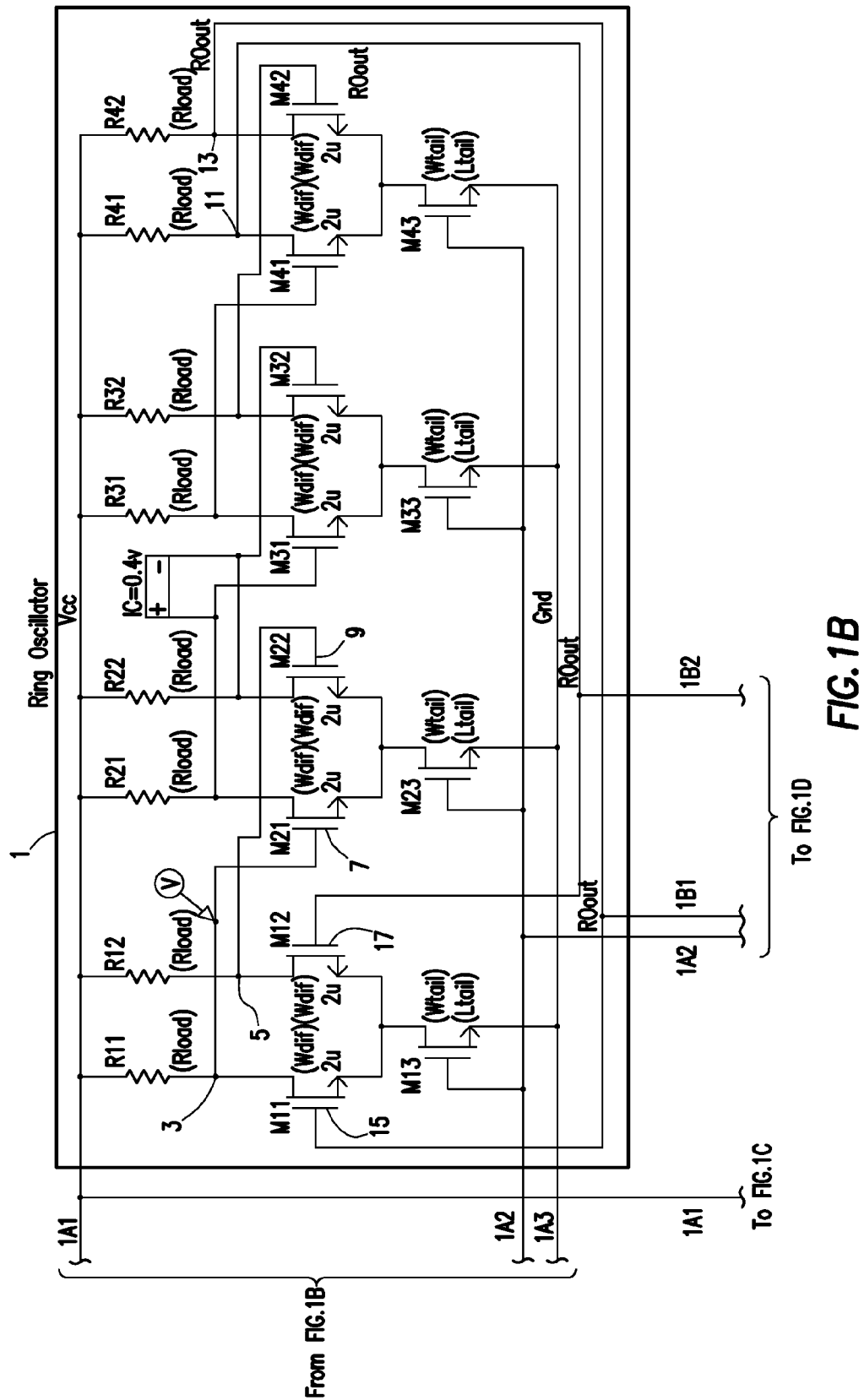
Figure 1C:
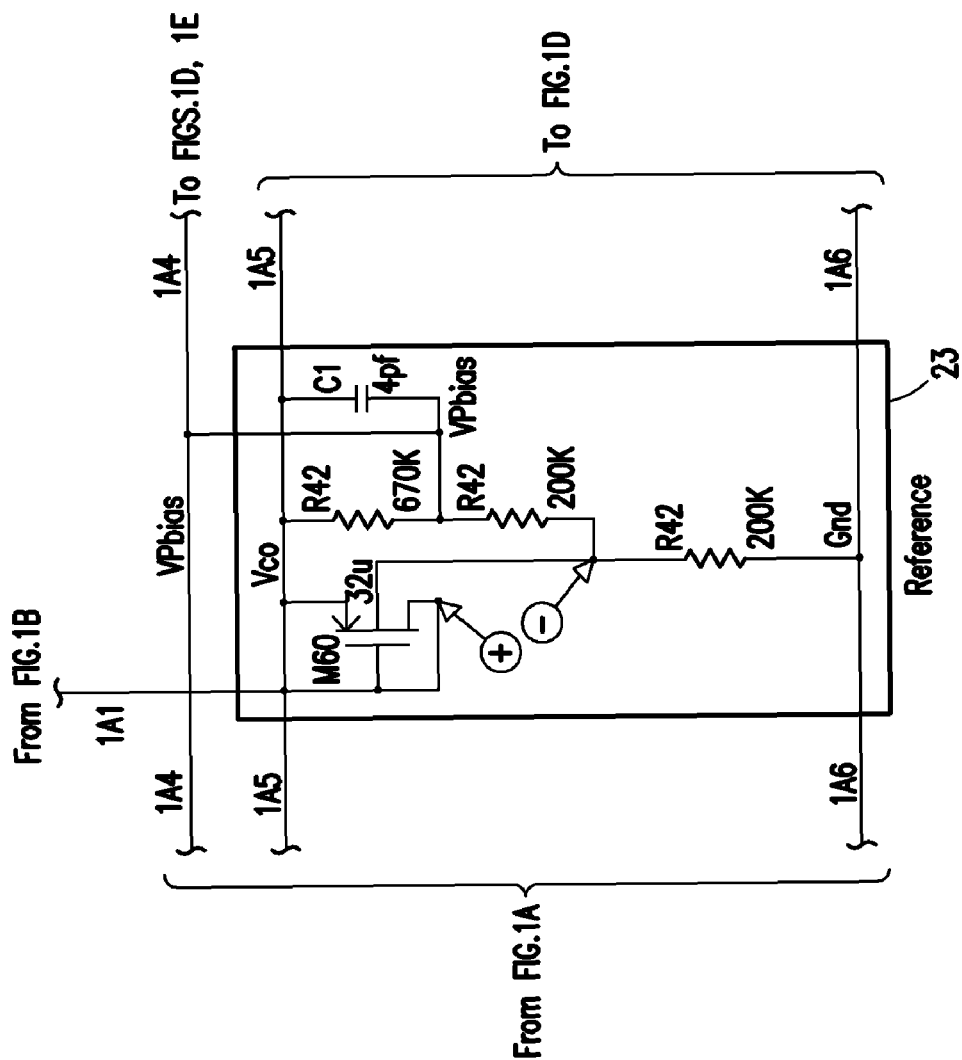
Figure 1E:
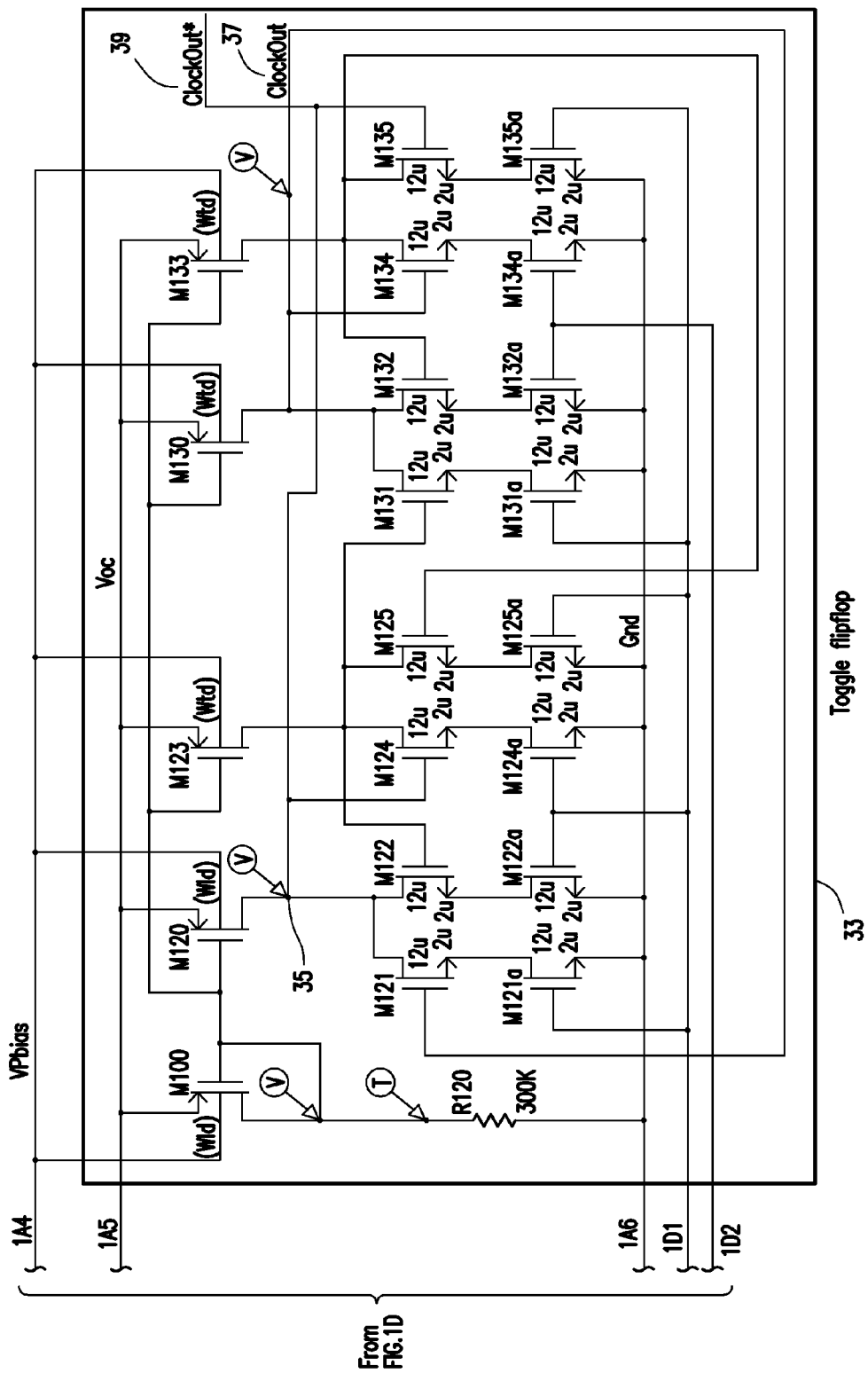

The low voltage oscillator of the invention provides an oscillator for clocking and signal transmission, e.g., within the body, using very low supply voltage. One embodiment of the in-vivo low voltage oscillator is designed to work with a battery that will provide a supply voltage that ranges from 0.8 to 2.1 V, such as 0.8 to 1.6 V, including from 0.8 V and 1.2 V. Other voltage ranges are possible in other applications, such as about 0.7 V to about 5.0 V, or about 0.7 V to about 100 V. In certain embodiments, the supply voltage can range from 0.5V to 10V, such as from 0.8V to 5.0V, and including from 1.7V to 2.1V. The voltage provided by the battery can vary, e.g., depending on how much current is pumped into the body. The lower voltage levels may occur when a lot of current is pushed into the body, such as during signal transmission.

One embodiment of the low voltage oscillator runs well on low voltages down to about 0.8 V, and provides a relatively constant frequency even when the power supply voltage is varied. As such, the output frequency is stable despite varying supply voltage. By stable is meant that any variation in output frequency in certain embodiments vary by 10% or less, 5% or less, 2% or less, 1% or less, despite substantial variations in supply voltage within the range of supply voltage for which the oscillator is configured to operate, e.g., as described above. In certain embodiments, the magnitude of varying supply voltage may be 1% or more, 2% or more, 5% or more, 10% or more, etc.

The low voltage oscillator can be utilized even when the battery supply voltage is close to or below the transistor threshold. For example, in the medically suitable AMI 0.5 micron process, the N channel threshold is 0.6 to 0.7 V, while the P channel threshold is 0.9 V. The in-vivo low voltage oscillator can operate smoothly with these thresholds at a battery supply as low as about 0.8 V.

There are other processes which would provide lower threshold voltages and allow for normal logic to be used, but they are not as suitable for use in the body. As other processes are developed that can support lower threshold voltages, the in-vivo low voltage oscillator can be easily implemented at lower voltages.

As such, embodiments of the low voltage oscillator can be operated in the sub threshold region. Embodiments of the oscillator are designed to operate in two regions, i.e., saturated and subthreshold. Subthreshold region is below threshold voltage of transistor where transistor is very weakly on or almost off. The advantages of using circuits in a subthreshold region include realization of significantly lower power consumption and higher gain for operation.

Embodiments of the subject low-voltage oscillators are configured to exhibit low power consumption. Low power consumption oscillators of the invention include those configured to run at 50 µA or less, such as 30 µA or less (e.g., 26 µA), including 15 µA, such as 10 µA or less. As such, embodiments of the invention produce a stable output frequency with a current draw of 50 µA or less, such as 30 µA or less.

In certain embodiments, the oscillators of the invention are ones that have a low value according to the following Figure of Merit for power consumption. The following Figure of Merit for power consumption is used to compare power consumption of oscillators that operate at different frequencies and supply voltages by normalization. The oscillator with lower Figure of Merit for power is consumption value ($FM_{power}$) is a lower power oscillator.

$$FM_{Power} = I_{total}/(F_{osc} * V)$$

Where, $I_{total}$=Total current consumption for oscillator with bias and output circuits $F_{osc}$=Frequency of oscillation V=Supply voltage In certain embodiments, the oscillators have an $FM_{power}$ value of $9 \times 10^{-6}$ or lower, such as $7.5 \times 10^{-6}$, including $6.8 \times 10^{-6}$.

This very low power consumption is provided in certain embodiments by employing one of the following several design features. In certain embodiments, a spoliator is provided with a sleep mode when the oscillator is not being employed. In certain embodiments, a kick-start feature is provided, which avoids stabilization problems, and allows the oscillator to come on line very quickly.

In certain embodiments, the oscillator is configured to cover a small surface area, e.g., to reside on a die or support with a small surface, e.g., of 1 mm$^2$ or less, such as 0.5 mm$^2$ or less.

In certain embodiments, the oscillators of the invention are programmable to provide for varying output frequencies of interest. In certain embodiments, programmability is achieved by doing one or more of the following: modulating tail current, e.g., by a magnitude of 50% or less from an initial value, changing transistor size in differential pair (changing gain); or modulating effective delay of a delay element, e.g., by a magnitude of 50% or less from an initial value. For example, in certain embodiments effective delay is modulated by changing effective load with programmable switches.

As summarized above, embodiments of the low-voltage oscillator of the invention are configured to be employed as components of a medical device. The low voltage oscillator of the invention can be configured to be a component of a variety of different types of medical devices. Medical devices in which the low-voltage oscillator finds use include, but are not limited to: implantable medical devices, such as implantable pulse generators; ingestible event markers, including pharma-informatics enabled pharmaceutical compositions; parenteral fluid delivery systems, including in vivo and/or ex vivo components thereof; signal receivers configured to be in or on a body; etc. Examples of the above types of medical devices are described in greater detail below. In certain embodiments, the oscillator is configured to be employed with an in vivo medical device, i.e., a device configured to be employed in or on the body. In these embodiments, the low voltage oscillator may be viewed as an in vivo low voltage oscillator.

In one embodiment of the in-vivo low voltage oscillator, the oscillator includes a ring oscillator which includes transistors and resistors arranged in differential pairs. Looking at the Ring Oscillator block of FIG. 1, M11, M12, M13, R11, and R12 comprise one such differential pair. The ring oscillator is designed so that the voltage difference at each differential pair is constant, such as about 0.3V.

Because the ring oscillator is differential, it is relatively independent of battery voltage. There is a true and bar output at the same time, and when one goes high, the other goes low. There is a constant current going through the tail. In the differential pair mentioned above, this means there is a constant current through M13. Thus, either the current is traveling down the R11 branch and the voltage at node 3 is low ($V_{low}$) while the voltage at node 5 is high ($V_{high}$), or the current is traveling down the R13 branch and the voltage at node 5 is low while the voltage at node 3 is high. This creates a relatively constant tail current. The voltage difference between $V_{low}$ and $V_{high}$ can vary without significantly changing the tail current. Also, $V_{low}$ may go down while $V_{high}$ goes up, creating an effective voltage difference which is twice as much as the voltage change at each node.

On the first pass through the differential pair stages, the outputs will all be high. The true side voltage 3 is connected to the true side input 7 of the next stage, and the bar side voltage 5 is connected to the bar side input 9 of the next stage. At the last stage, the two lines are inverted, and the true side 11 is connected to the bar input 17 of the first stage, and the bar side 13 is connected to the true side 15 of the first stage. This forces the stages to go low during the second time through the stages, creating the oscillation. There must be an odd number of inversions in an oscillator so the circuit does not latch up. In a standard single-ended ring oscillator in which a number of inverters are connected in a loop, there must be an odd number of stages. With a ring oscillator, the connection between two of the stages is inverted, and an even number of stages can be used.

There are several ways to control the frequency of the oscillator. The number of stages used in the ring oscillator helps to dictate the frequency of the oscillator. In the embodiment of FIG. 1, there are four differential pair stages. This is an arbitrary number and is chosen to match the desired frequency of the oscillator. If a lower frequency is desired, more stages can be added. For example, if eight stages are used instead of four, the frequency will be decreased by a factor of two, but more current is used. Conversely, if fewer stages are used, the frequency of the oscillator can be increased.

Another method which can be employed to change the frequency is to add a toggle flip-flop block. In the embodiment in FIG. 1, there is a toggle flip-flop block which lowers the frequency by a factor of two. This block will be discussed in greater detail later. If the frequency is desired to be lowered further, another toggle flip-flop block can be added.

Because embodiments of the low voltage oscillator are designed for use within a very small system, such as in a pharmaceutical pill, it is important that the overall size be kept to a minimum. The total area of the oscillator for the embodiment of FIG. 1 was desired to be under about 1 mm$^2$. The resistors are 1 kΩ per square, meaning there is an aggregate of 10 MΩ that can be used. In doing simulations for the embodiment in FIG. 1, it was found that having 500 kΩ resistors would work for the oscillator. This provides an aggregate resistance of about 9 MΩ.

In embodiments where the chip can be made bigger, the resistors can be larger. At much larger resistances, however, the capacitance of the attached transistors becomes an issue and introduces some rise time.

With the load resistors in the ring oscillator set to 500 kΩ, they are 500 squares, meaning they are 500 times longer than they are wide. With this measurement, they can easily be made very accurately. Instead of a resistive load, a P channel transistor could be used with a bias.

The size of the transistors is fairly large in certain embodiments, such as about 1024 lambda, or about 256 microns in order to provide enough gain to allow switching with a small differential signal. Compared to the area of the resistors however, the total area of the transistors is quite small. By making the transistors larger, there is not much voltage across the source to the drain. The voltages at $V_{low}$ and $V_{high}$ are able to be maintained at a relatively high voltage.

The design of the ring oscillator depends on the assumption that the tail current can be kept constant with power supply changes and the voltage swing. In order to do this, the voltage at M13, M23, M33, and M43 must be controlled.

In one embodiment of the low voltage oscillator, there is a replica bias block to accomplish this. The replica bias block shown in FIG. 1 includes a copy of the differential amplifier setup found in the ring oscillator. This consists of R1, R2, M1, M2, and M3. There is an amplifier 21 and a reference block 23. A feedback loop is set up to control the current through M3 and set $V_{low}$ and $V_{high}$ to be about 0.3 V below the supply voltage. The voltages $V_{low}$ and $V_{high}$ are put in to the inputs of M1 and M2, respectively, with a desired goal of finding the voltage at M3 that will produce this condition while being independent of the power supply voltage. Amplifier 21 is set up so that if the voltage at M3 is too low and the current leaving M3 is too low, then the amplifier makes the voltage at M3 a little higher. It is a feedback loop that makes adjustments until the proper voltage is applied to give the desired voltage swing between $V_{low}$ and $V_{high}$. The voltage at M3 is then decoupled with capacitor C2 and fed to M13, M23, M33, and M43. This ensures that when the replica bias differential amplifier is configured to provide the proper voltage swing, the differential amplifiers in the ring oscillator will behave similarly. As the voltage changes from the power supply, the voltage between $V_{low}$ and $V_{high}$ at the differential amplifiers in the ring oscillator will remain constant. The frequency also remains relatively constant.

Capacitor C2 is employed in certain embodiments to stabilize the feedback of the feedback amplifier 21. If capacitor C2 is not there or too small, the feedback circuitry will oscillate at higher voltages. If the capacitance of capacitor C2 is too high, it will slow down the feedback, and prolong the response time of the circuit. Therefore, capacitor C2 is sized enough to prevent oscillations, while being small enough to quickly respond to changes in voltage. There is a lot of room for adjustment in C2 without compromising performance. The size of the transistors on the feedback amplifier 21 can also be adjusted, which changes their capacitance.

In one embodiment of the in-vivo low voltage oscillator, there is a reference block 23 which provides the particular voltage swing which is desired. MOS transistor M60 can be configured as a diode with a turn-on voltage of 0.6 V. A fraction of this 0.6 V can be taken and used as a reference. For example, if a 0.3 V swing is desired, half of the 0.6 V turn-on voltage can be taken. This fraction is set as $VP_{bias}$. $VP_{bias}$ is used to pull down Vlow, while Vhigh is set to the supply voltage. This provides the voltage swing necessary for the other differential amplifier stages. Because diode M60 has a logarithmic relationship with voltage, the current will be relatively stable over the range of the supply voltage. Resistors R60 and R61 can be of large value in order to be stable with voltage.

In another embodiment of the in-vivo low voltage oscillator, a Schottky diode can be substituted for M60, which can save some current because R60 would not need to be biased.

Capacitor C1 is used to stabilize $V_{cc}$, because when the flip-flop switches, there is capacitance between the gate and the substrate which will kick charge back into $V_{cc}$. There are many ways of accomplishing this goal. Capacitor C1 can be used to protect $Vc_c$, and can be quite large. The drawback to having a large capacitance, is it takes a longer amount of time to stabilize when the circuit is powered on. Capacitor C1 is also tied to the rail, to stabilize $VP_{bias}$ maintain to the specified voltage drop even with a sharp change in the supply voltage.

In another embodiment, there can be separate bias for the substrates. In yet another embodiment, there can be an amplifier buffering the bias voltage. For example, amplifier 21 can be used to buffer $V_{cc}$.

Voltage VPbias does not have to be used for the reference block, but was chosen because it was close to optimal value for this particular embodiment and was readily available.

The voltage reference in reference block 23 is chosen to be able to operate at low voltage. Common voltage references typically require more voltage than is needed for the in-vivo low voltage oscillator. For example, a MOS band gap is often used as a voltage reference, because it is relatively constant with time, but it requires 1.2 V to run properly.

The circuitry which is used in conjunction with the low voltage oscillator can run on normal logic gates, such as CMOS gates. In one embodiment of the in-vivo low voltage oscillator, the differential 0.3. V logic can be converted to normal logic.

In one embodiment of the in-vivo low voltage oscillator, there is an output conversion and buffering block 25 which converts the output to normal logic. The output conversion and buffering block takes $V_{low}$ and $V_{high}$ from one of the differential amplifiers in the ring oscillator block and swings them to another differential amplifier that is not balanced. In the embodiment of FIG. 1, differential amplifier 27 in output conversion and buffering block 25 is made up of R71, R72, M71, M72, and M73. Voltage $V_{low}$ at node 11 is fed to the input of M71, while voltage $V_{high}$ at node 13 is fed to the input of M72. Transistor M71 is the same length as the transistors in the differential amplifiers in the ring oscillator block 1, while transistor M72 has a length of half that value. That size difference provides a larger voltage swing than the 0.3 V in the ring oscillator.

The voltage at node 29 is fed to the input of transistor M82. Transistor M82 is chosen to be a normal N channel transistor which can work at low voltages. A normal P channel transistor is difficult to use at such low voltages. There is a relatively low resistive load placed on transistor M82. In the case of the embodiment of FIG. 1, resistor R80 has a value of 250 kΩ. The resistor is chosen to be smaller in order to be able to pull the voltage down. There is a relatively large amount of voltage fed into transistor M82, causing it to turn on all the way. Transistor M82 provides gain which allows the voltage differential to swing even lower than that provided by differential amplifier 27, though not all the way to 0 V.

Next, the output at node 31 is connected to a series of inverters. In the embodiment of FIG. 1, there are three inverters. The inverters utilize normal P channel transistors M83, M85, and M87, which have a 0.9 V threshold. Because the circuit must be able to run at voltages as low as about 0.8 V, this threshold must be overcome. This is done by connecting the substrate of P channel transistors to $VP_{bias}$, effectively changing the charge carrier profile in the P channel transistor and reducing the threshold. The bias voltage applied can vary, but is chosen as $VP_{bias}$ for convenience. With the substrate biased, the inverters can operate at low voltages, such as about 0.8 V. Multiple inverters can be used to sharpen the waveform. In the embodiment of FIG. 1, three inverters are used. The output will be produced when the supply voltage is between about 0.8 V and about 1.2 V, but the clock signal will not have an equal duty cycle. With the way the P channels and N channels are balanced, the high time will be longer at the lower voltages than at the higher voltages, and the duty cycle can vary from about 40% to about 70%.

Although the duty cycle may vary, this setup can produce a square clock signal that has quick rise times. In one embodiment of the in-vivo low voltage oscillator, there is a toggle flip-flop block to square the wave and reduce the frequency provided by the ring oscillator. In the embodiment of FIG. 1, toggle flip-flop block 33 uses normal logic P channel and N channel transistors. The P channel transistors M100, M120, M123, M130, and M133 are biased with $VP_{bias}$ to reduce the threshold. The resistive load is controlled with a current mirror. Transistor M100 is configured as a diode, and there is only one diode connected load. That is used to generate the constant current for the other gates in the current mirror at node 35. The current is not absolutely constant, but is more stable than if the diode were connected to the rest of the block. This allows shorter rise times. There is a slight increase in rise time at 0.8 V, because the circuit is current starved. This can be changed by adjusting the size of some of the transistors, but is still close to a square wave in the current configuration.

The toggle flip-flop block can include multiple latches with crossed outputs. This cuts the frequency in half by adding a delay. If the frequency is desired to be cut in half again, another toggle flip flop can be added.

Another way to reduce the frequency would be to double the number of differential amplifiers in the ring oscillator. This may require more real estate versus adding a toggle flip flop, because of the added resistors.

The output after the toggle flip flop block is a square wave with short rise times and half the frequency of the ring oscillator. There is a clock output 37 and clock bar output 39.

Figure 2A:
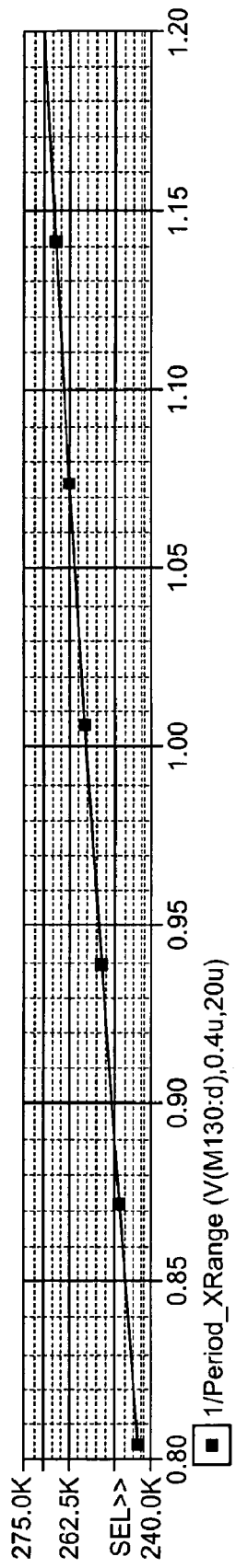
FIG. 2A is a plot of simulation data of the output frequency versus supply voltage for the embodiment of FIG. 1.

FIG. 2A shows simulation data for the output frequency versus power supply voltage for the embodiment of FIG. 1. The frequency raises as the supply voltage increases from 0.8 V to 1.2 V, but stays within a manageable range which can be picked up by a receiver. In the case of a simulation of the embodiment of FIG. 1, the frequency goes from about 243 kΩ at a supply voltage of 0.8 V, to about 270 kΩ at a supply of 1.20 V. Because the gain of the differential amplifiers in the ring oscillator is actively adjusted under changing supply voltage, the output frequency remains stable even with quick fluctuations in supply voltage. Other frequency ranges can be used for other embodiments.

Similar frequency stability are observed with this circuit architecture from any minimum to maximum voltage range, such as about 0.7 V to about 5.0 V, or about 1 V to about 100 V.

Figure 2B:
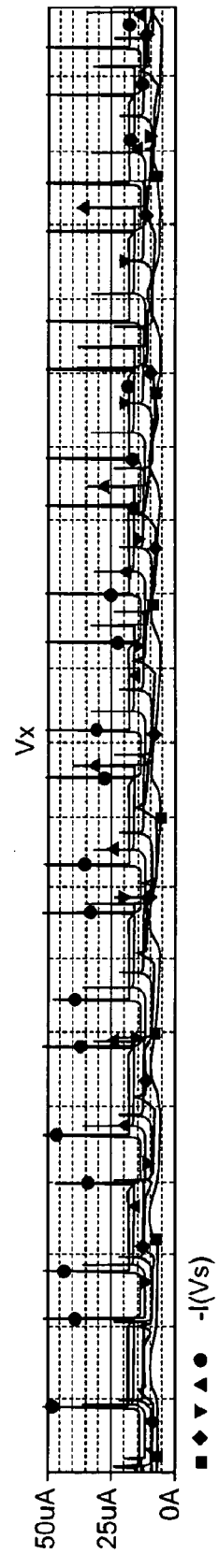
FIG. 2B is a plot of simulation data of the current drawn by the circuit in the embodiment of FIG. 1.

FIG. 2B shows simulation data for the current drawn by the embodiment of FIG. 1. The square marker plot is at 0.80 V power supply, the diamond marker plot is at 0.90 V power supply, the downward pointing triangle marker plot is at 1.0 V power supply, the upward pointing triangle marker plot is at 1.1 V power supply, and the circular marker plot is at 1.2 V. As seen in the plot, the current increases with power supply voltage. The current drawn by the circuit on average remains relatively low, such as from about 5 μA to about 20 μA.

Figure 2C:
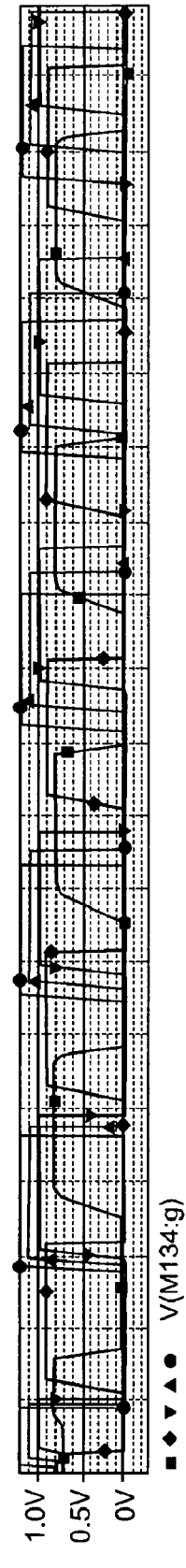
FIG. 2C is a plot of simulation data of the output of the embodiment of FIG. 1.

FIG. 2C shows simulation data for the output voltage signal for the embodiment of FIG. 1 of the in-vivo low voltage oscillator. The voltage is measured at transistor M134. The frequency has been cut in half from the output of the output conversion and buffering block. The voltage swing goes as low as about 0 V, and up to about the power supply voltage. The square marker plot is at 0.80 V power supply, the diamond marker plot is at 0.90 V power supply, the downward pointing triangle marker plot is at 1.0 V power supply, the upward pointing triangle marker plot is at 1.1 V power supply, and the circular marker plot is at 1.2 V.

Figure 2D:
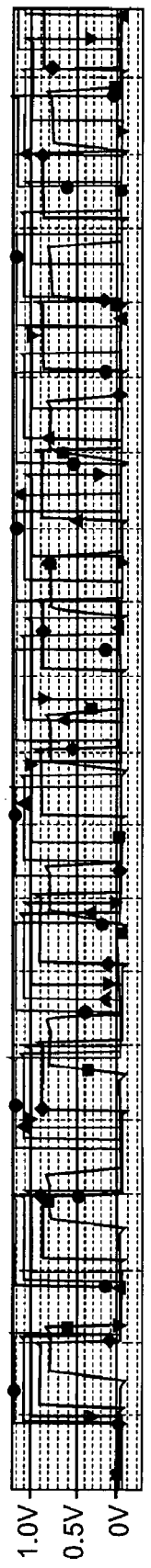
FIG. 2D is a plot of simulation data of the output of the output conversion and buffering block of the embodiment of FIG. 1.

FIG. 2D shows simulation data for the output voltage signal measured at transistor M87 at the output of the output conversion and buffering block in the embodiment of FIG. 1. The square marker plot is at 0.80 V power supply, the diamond marker plot is at 0.90 V power supply, the downward pointing triangle marker plot is at 1.0 V power supply, the upward pointing triangle marker plot is at 1.1 V power supply, and the circular marker plot is at 1.2 V. The frequency is approximately twice as high as the frequency in the signal of FIG. 2C. The voltage swing goes as low as about 0 V, and up to about the power supply voltage. The duty cycle of the square wave changes with the power supply voltage, with the lower voltages having a shorter high time. The frequency variations can also be seen in this plot, with the lower supply voltages having slightly lower frequencies.

Figure 2E:
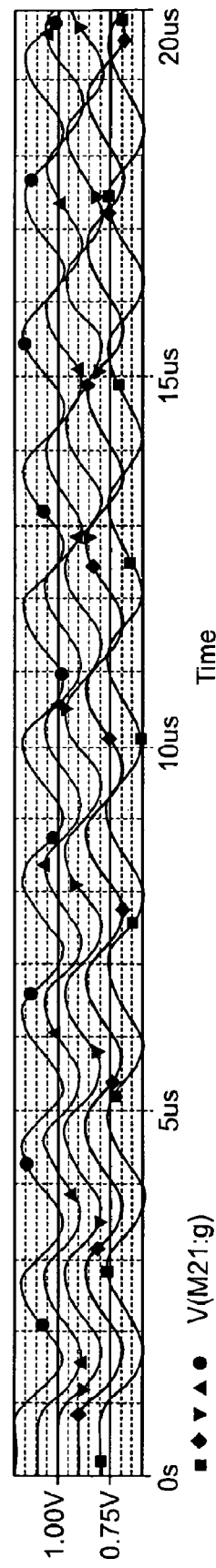
FIG. 2E is a plot of simulation data of the output of the ring oscillator block of the embodiment of FIG. 1.
Figure 3A:
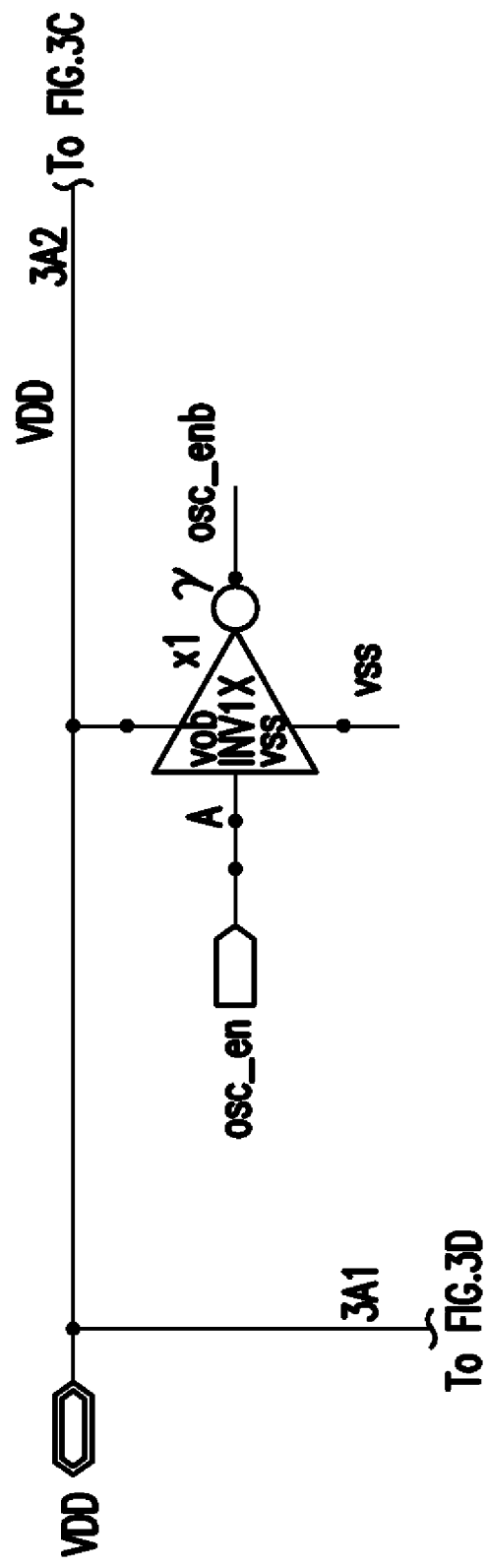
FIGS. 3A-E is a circuit diagram of an embodiment of an in-vivo low voltage oscillator.
Figure 3B:
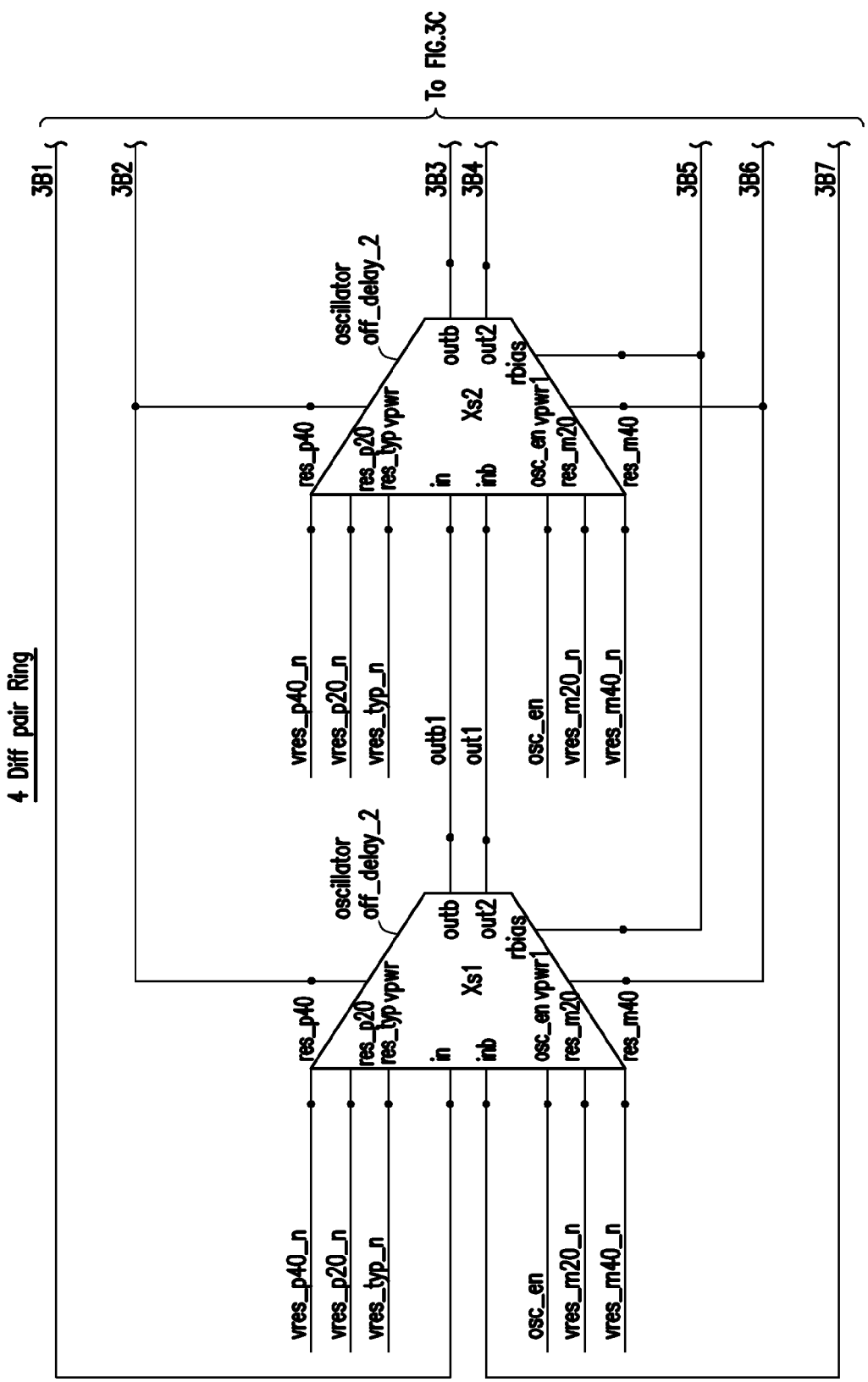
Figure 3C:
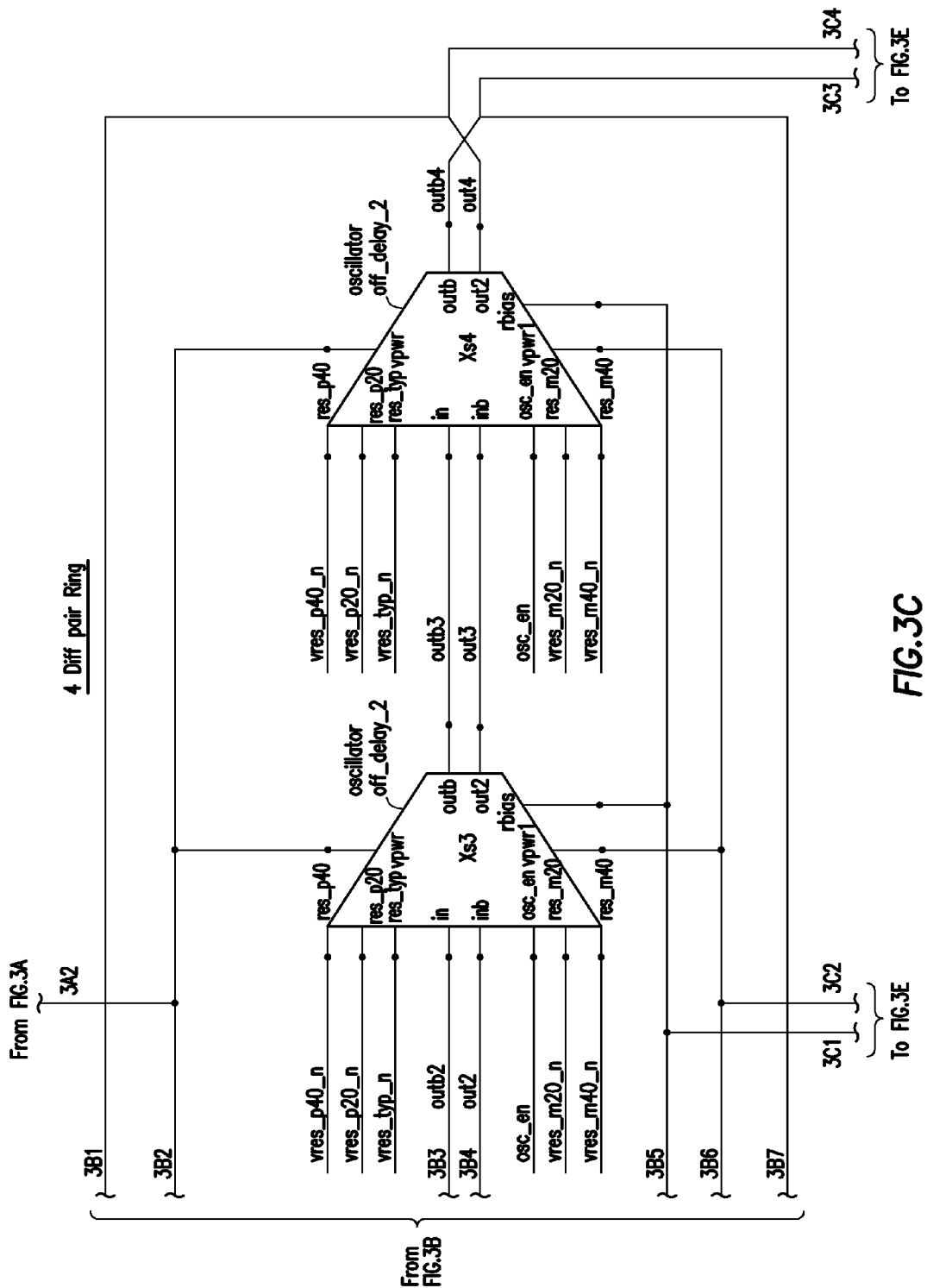
Figure 3D:
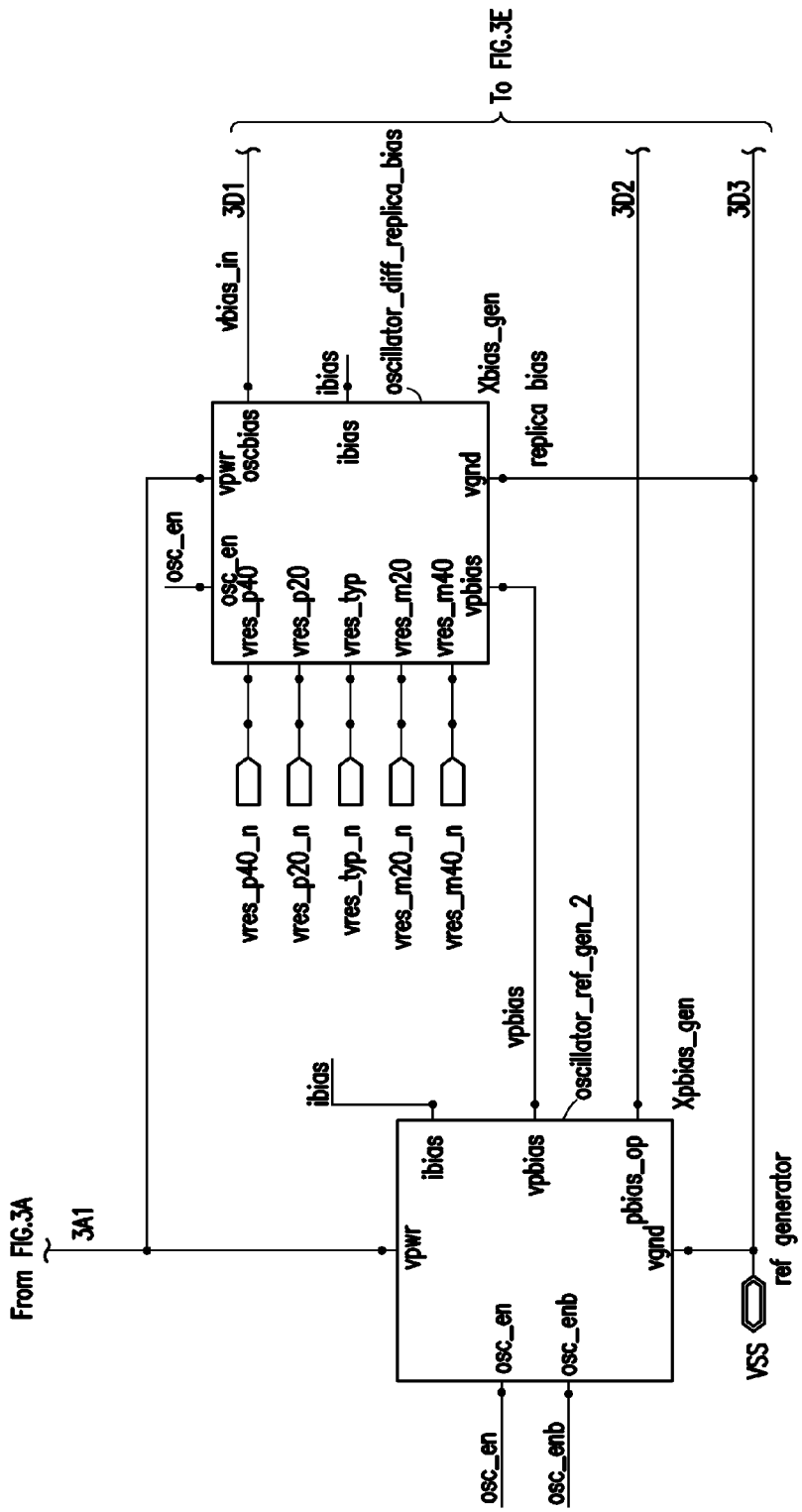
Figure 3E:
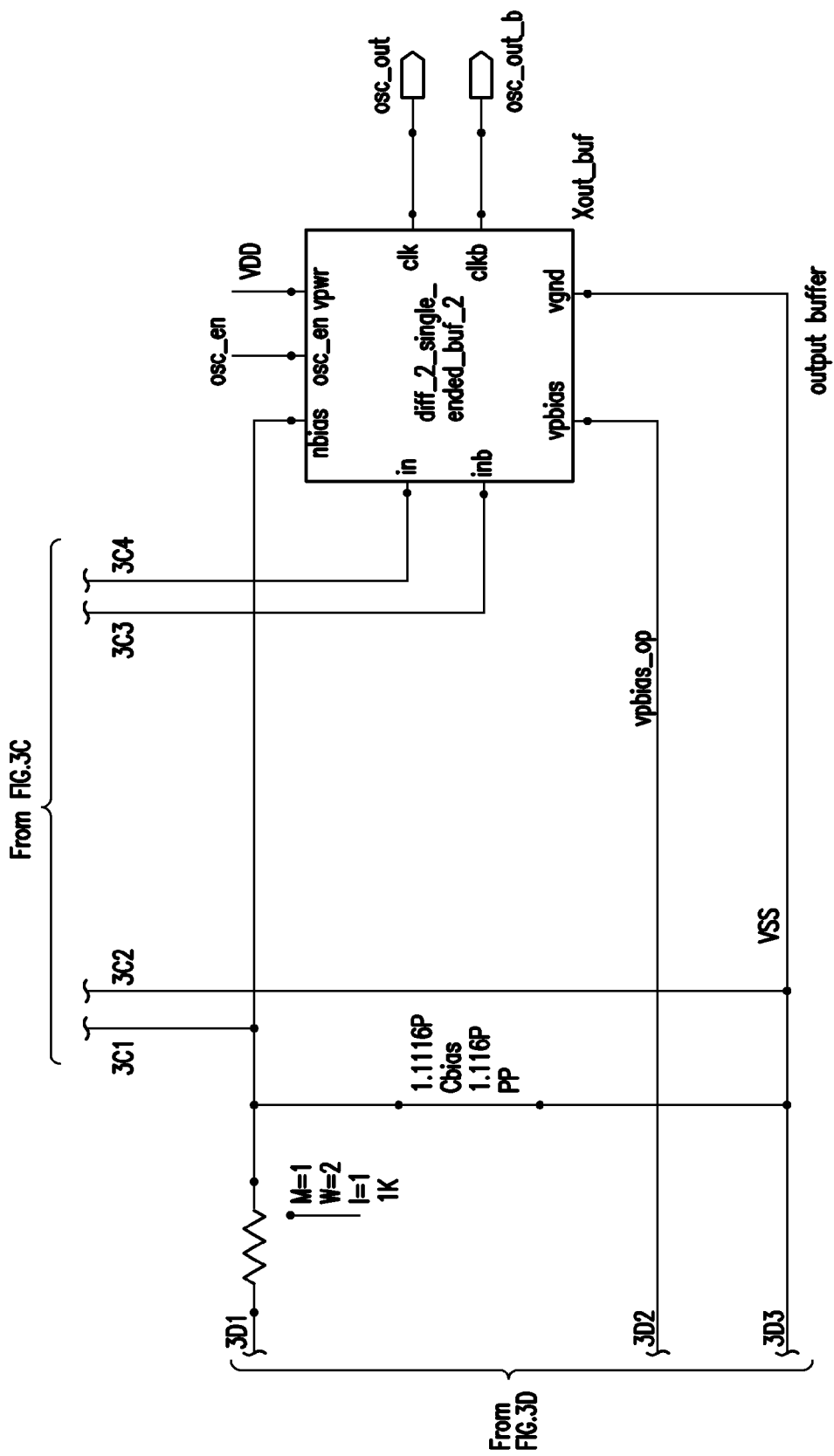

FIG. 2E shows simulation data for the output voltage signal measured at transistor M21 in the ring oscillator of the embodiment of FIG. 1. It shows the voltage signal produced by the ring oscillator over various supply voltages from 0.8 V to 1.2 V. The square marker plot is at 0.80 V power supply, the diamond marker plot is at 0.90 V power supply, the downward pointing triangle marker plot is at 1.0 V power supply, the upward pointing triangle marker plot is at 1.1 V power supply, and the circular marker plot is at 1.2 V. The voltage goes up to the supply voltage and is pulled down a uniform amount, regardless of supply voltage. In this case, the voltage swings down about 0.2 V. The waveform is relatively sinusoidal.

The voltage signal in FIG. 2E is sent to the output conversion and buffering block, where it is transformed into the voltage signal in FIG. 2D. The voltage signal in FIG. 2D is then sent to the toggle flip-flop block, where it is transformed into the output voltage signal in FIG. 2C.

As described above, the low voltage oscillators of the invention find use as components in a variety of different types of medical devices. As such, also provided are medical devices in which a low voltage oscillator of the invention can is a component. Medical devices in which the low-voltage oscillators of the invention find use include, but are not limited to: implantable medical devices, such as implantable pulse generators; ingestible event markers, including pharma-informatics enabled pharmaceutical compositions; parenteral fluid delivery systems, including in vivo and/or ex vivo components thereof; signal receivers configured to be in or on a body; etc. Examples of the above types of medical devices are described in greater detail below. In certain embodiments, the oscillator is configured to be employed with an in vivo medical device, i.e., a device configured to be employed in or on the body. In these embodiments, the low voltage oscillator may be viewed as an in vivo low voltage oscillator.

One type of medical device in which the subject oscillators may a component thereof is an implantable medical device, which is a medical device that is configured to be wholly implanted in a body. These types of devices include implantable pulse generators, which devices include a control unit (e.g., as may be referred to in the art as a "can") and one or more leads extending from the control unit. Such devices find use in cardiac therapy, neural stimulation, etc. Of interest are cardiac implantable pulse generators which include addressable multiple electrodes on a lead. Such devices include those described in: PCT/US2003/039524 published as WO 2004/052182; PCT/US2004/001806 published as WO 2004/067081; PCT/US2004/001834 published WO 2004/066817; PCT/US2004/001814 published as WO 2004/066814; PCT/2005/031559 published as WO 2006/029090; PCT US2005/036035 published as WO 2006/042039; PCT US2005/046811 published as WO 2006/069322; PCT/US2005/046815 published as WO 2006/069323; and PCT US2006/048944 published as WO 2007/075974; the disclosures of which are herein incorporated by reference. The oscillator may be a component of one or more circuitry elements of the device, e.g., as may be present in a satellite electrode controller, at an interface circuit between a lead and "can" circuitry, etc.

Another type of medical device in which the oscillators of the invention find use is in the circuitry of ingestible event markers, including those found in pharma-informatics enabled pharmaceutical compositions. Ingestible event markers that may include the oscillators of the invention as components thereof, e.g., on the circuitry thereof, include those described in 60/949,223 titled "Ingestible Event Marker" and filed on Jul. 11, 2007; the disclosure of which is herein incorporated by reference.

The low voltage oscillators may be utilized in the system described in PCT application "Pharma-Informatics System" PCT/US2006/016370, filed Apr. 28, 2006, hereby incorporated by reference in its entirety. The oscillator and accompanying circuitry can be placed in or around a pill containing a pharmaceutically active agent. When the pill is ingested and begins to dissolve, the fluids in the body can activate a, microbattery which can then provide power to a transmitter which includes the in-vivo low voltage oscillator and transmit a signal with a code specific to that pill. The code can then be picked up and decoded by a receiver located inside or in close proximity to the body. The receiver can then send the pill ID along with any other pertinent information to another unit for data collection and processing. In this manner a patient's compliance with medication regimens as well as other medical information can be monitored. The oscillators also find use in the applications described in U.S. provisional application Ser. Nos.; 60/862,925 titled "Controlled Activation Pharma-Informatics Systems" and filed on Oct. 26, 2006; 60/866,581 titled "In-vivo Transmission Decoder" and filed on Nov. 21, 2006; 60/887,780 titled "Signal Receivers for Pharma-Informatics Systems" and filed Feb. 1, 2007; 60/889,868 titled "Pharma Informatics System Power Source" and filed Feb. 14, 2007; 60/889,870 titled "Pharma Informatics System Power Source Having High Surface Area Cathodes" and file don Feb. 14, 2007; 60/889,871 titled "Pharma Informatics System Having Short Resistant Series Battery" filed Feb. 14, 2007; 60/894,171 titled "Multi-Directional Transmitter for Pharma-Informatics System" and filed on Mar. 9, 2007; 60/894,167 titled "Deployable Antenna For Pharma-Informatics System" and filed on Mar. 9, 2007; 60/915,635 titled "Electro-Mechanical Multi-Directional Transmitter" and filed on May 2, 007; 60/940,063 titled "Signal Transmission Antenna For Pharma-Informatics System" and filed on May 24, 2007; 60/945,251 titled "Accurate, Low Overhead Iterative Decoder" and filed on Jun. 20, 2007; 60/949,208 titled "Low Power, Ingestible Pharma-Informatics System" filed Jul. 11, 2007; and 60/956,694 titled "Personal Health Signal Receivers" and filed on Aug. 18, 2007; the disclosures of which are herein incorporated by reference.

Another type of medical device in which the oscillator of the invention may be used as a component thereof is a smart informatics enabled parenteral fluid delivery system, e.g., as described in PCT application No. PCT/US2007/015547 titled "Smart Parenteral Administration System," and filed on Jul. 6, 2007; the disclosure of which is herein incorporated by reference. Parenteral fluid delivery systems in which the oscillators may be a component are systems that deliver a quantity of a fluid (e.g., gas or liquid) to a patient by a route other than the digestive tract, e.g., via a pulmonary route, via intramuscular injection, via intravenous delivery, etc. For purposes of describing the present invention, pulmonary administration is considered to be parenteral administration because delivery is via the lungs, even though entry to the lungs is via the mouth and/or nasal passages. As such, fluid delivery devices that may include oscillators of the invention as a component thereof, e.g., in a signal broadcaster element of the system, include systems that include syringes, intravenous systems, infusion pumps, dialysis systems, ventilators, anesthesia machines, nebulizers/inhalers, etc. The delivery device will include a fluid transfer signal generator, e.g., in the form of an integrated circuit or other suitable structure, that transmits a signal to a receiver upon transfer of fluid to the patient. This signal general may include an oscillator of the invention. The signal generator which includes the oscillator of the invention may be a part of a variety of different components of the system, depending on the particular nature of the system. As such, the signal generator including the oscillator may be a component of a syringe, an IV bag, an IV pump, a dialysis unit, an inhalation device, etc.

Oscillators of the invention may also be components of signal receivers that are configured to be positioned in or on a body, such as those described in in: PCT/US2006/16370 titled "Pharma-Informatics System" and filed on Apr. 28, 2006; as well as U.S. Provisional Application Ser. No. 60/887,780 titled "Signal Receivers for Pharma-Informatics Systems" filed on Feb. 1, 2007; the disclosures of which are herein incorporated by reference.

It is to be understood that this invention is not limited to particular embodiments described, as such may vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein, by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A mechanical resonator-free low voltage oscillator that produces a stable output frequency with varying supply voltage, the oscillator comprising:
   a replica bias block comprising a differential pair;
   wherein the replica bias block further comprises an amplifier coupled to the differential pair in the replica bias block to form a negative feedback;
   wherein the output of the amplifier is coupled to a gate of a tail transistor of the differential pair in the replica bias block, wherein a current flowing through the tail transistor remains substantially constant.

2. The low-voltage oscillator according to claim 1, wherein said low voltage oscillator is a crystal resonator-free oscillator.

3. The low-voltage oscillator according to claim 1, wherein said oscillator produces said stable output frequency from a supply voltage ranging from 0.8 to 2.1 V.

4. The low-voltage oscillator according to claim 3, wherein said oscillator produces said stable output frequency from a supply voltage ranging from 0.8 to 1.6 V.

5. The low-voltage oscillator according to claim 4, wherein said oscillator produces said stable output frequency from a supply voltage ranging from 0.8 to 1.2 V.

6. The low-voltage oscillator according to claim 1, wherein said oscillator is configured to reside on a die with an area of 1 $mm^2$ or less.

7. The low-voltage oscillator according to claim 1, wherein said oscillator is configured to reside on a die with an area of 0.5 $mm^2$ or less.

8. The low-voltage oscillator according to claim 1, wherein said oscillator can produce said stable output frequency with a current draw of 50 µA or less.

9. The low-voltage oscillator according to claim 8, wherein said oscillator can produce said stable output frequency with a current draw of 30 µA or less.

10. The low-voltage oscillator according to claim 1, wherein said oscillator comprises a ring oscillator block.

11. The low-voltage oscillator according to claim 10, wherein said ring oscillator block comprises a number of cascaded differential pairs, wherein the output of a respective differential pair is coupled to the input of the next differential pair.

12. The low-voltage oscillator according to claim 11, wherein a gate and source of a tail transistor in a given differential pair are coupled to a gate and source of a tail transistor in each differential pair in the ring oscillator block.

13. The low-voltage oscillator according to claim 12, wherein a gate-to-source voltage of the tail transistor in the differential pair remains substantially constant during operation, wherein a tail current of each differential pair in the ring oscillator block remains substantially constant.

14. The low-voltage oscillator according to claim 11, wherein said number is an even number.

15. The low-voltage oscillator according to claim 11, wherein the differential pair in the replica bias block has a similar configuration as a respective differential pair in said ring oscillator block.

16. The low-voltage oscillator according to claim 15, wherein said replica bias block further comprises a capacitor coupled between the gate of the tail transistor and a ground line; and wherein the capacitance of the capacitor is sufficiently large to prevent oscillation in the replica bias block and sufficiently small to provide a fast response time.

17. The low-voltage oscillator according to claim 11, wherein said oscillator comprises an output conversion and buffering block coupled to the output of one of the differential pairs in the ring oscillator block to produce an oscillating signal with sufficient voltage swing which facilitates operation with other digital logic circuitry.

18. The low-voltage oscillator according to claim 15, wherein said oscillator comprises a reference block to provide a substantially constant voltage which is fed to one of the inputs of the differential pair in the replica bias block.

19. The low-voltage oscillator according to claim 18, wherein said reference block comprises a diode-connected transistor to provide a substantially turn-on voltage drop.

20. The low-voltage oscillator according to claim 17, wherein said oscillator comprises a toggle flip-flop block coupled to the output of the output conversion and buffer block to provide a signal with a substantially uniform duty cycle and a frequency lower than the frequency of the oscillating signal produced by the ring oscillator block.

21. An oscillator comprising:
a ring oscillator block comprising a number of cascaded differential pairs, wherein the output of a respective differential pair is coupled to the input of the next differential pair;
a replica bias block comprising a differential pair with a similar configuration as a respective differential pair in the ring oscillator block, wherein the replica bias block further comprises an amplifier coupled to the differential pair in the replica bias block to form a negative feedback; and
wherein the output of the amplifier is coupled to a gate of a tail transistor of the differential pair in the replica bias block, wherein a current flowing through the tail transistor remains substantially constant ;
and an output conversion and buffering block coupled to the output of one of the differential pairs in the ring oscillator block to produce an oscillating signal with sufficient voltage swing which facilitates operation with other digital logic circuitry;
wherein a gate and source of the tail transistor in the differential pair of the replica bias block are coupled to a gate and source of a tail transistor in each differential pair in the ring oscillator block;
wherein a gate-to-source voltage of the tail transistor in the differential pair remains substantially constant during operation, wherein a tail current of each differential pair in the ring oscillator block remains substantially constant; and
wherein the oscillator can produce the oscillating signal with substantially constant voltage swing and frequency with a supplied voltage from 0.8 V to 2.1 V.

22. A method comprising generating a clock signal from an oscillator according to claim 1.

23. The method according to claim 22, wherein said generating comprises:
coupling a supply voltage to a ring oscillator which comprises a number of differential pairs;
generating a reference tail voltage;
applying the reference tail voltage between a gate and source of each of the differential pair in the ring oscillator, wherein a current flowing through a tail of each differential pair remains substantially constant; and
converting the output of one differential pair in the ring oscillator so that the converted output has sufficient voltage swing to drive additional digital logic.

24. A medical device comprising mechanical resonator-free low voltage oscillator that produces a stable output frequency with varying supply voltages, the oscillator comprising:
a replica bias block comprising a differential pair;
wherein the replica bias block further comprises an amplifier coupled to the differential pair in the replica bias block to form a negative feedback;
wherein the output of the amplifier is coupled to a gate of a tail transistor of the differential pair in the replica bias block, wherein a current flowing through the tail transistor remains substantially constant.

25. The medical device according to claim 24, wherein said medical device is an implantable medical device.

26. The medical device according to claim 25, wherein said implantable medical device is an implantable pulse generator or a component thereof.

27. The medical device according to claim 24, wherein said medical device is an ingestible event marker.

* * * * *